United States Patent [19]

Rogers

[11] Patent Number: 5,397,991
[45] Date of Patent: Mar. 14, 1995

[54] MULTI-BATTERY CHARGING SYSTEM FOR REDUCED FUEL CONSUMPTION AND EMISSIONS IN AUTOMOTIVE VEHICLES

[75] Inventor: Wesley A. Rogers, Grosse Pointe Park, Mich.

[73] Assignee: Electronic Development Inc., Grosse Pointe Park, Mich.

[21] Appl. No.: 977,921

[22] Filed: Nov. 18, 1992

Related U.S. Application Data

[63] Continuation-in-part of Ser. No. 919,011, Jul. 23, 1992, which is a continuation-in-part of Ser. No. 607,237, Oct. 31, 1990, Pat. No. 5,179,340, which is a continuation-in-part of Ser. No. 218,539, Jul. 13, 1988, Pat. No. 4,968,941.

[51] Int. Cl.$^6$ .................. G01N 27/416; H01M 10/44; H02J 7/14
[52] U.S. Cl. .................. 324/434; 324/427; 320/15; 320/19; 320/48
[58] Field of Search .................. 324/426, 427, 434; 320/15, 19, 48; 429/61, 90, 91

[56] References Cited

U.S. PATENT DOCUMENTS

| | | | |
|---|---|---|---|
| 3,484,681 | 12/1969 | Grady, Jr. et al. | 324/428 |
| 3,727,074 | 4/1973 | Keller et al. | 324/428 X |
| 3,805,157 | 4/1974 | Acks et al. | 324/428 X |
| 4,041,363 | 8/1977 | Scheidler | 320/15 |
| 4,090,122 | 5/1978 | Hoinski | 320/6 |
| 4,204,162 | 5/1980 | Froidevaux | 324/427 X |
| 4,336,485 | 6/1982 | Stroud | 320/15 |
| 4,347,473 | 8/1982 | Stroud | 320/15 |
| 4,354,148 | 10/1992 | Tada et al. | 320/20 |
| 4,377,787 | 3/1983 | Kikuoka et al. | 324/431 |
| 4,387,332 | 6/1983 | Oyamada et al. | 320/15 |
| 4,677,363 | 6/1987 | Kopmann | 320/48 X |
| 4,679,000 | 7/1987 | Clark | 324/428 |
| 5,049,802 | 9/1991 | Mintus et al. | 320/2 |
| 5,049,803 | 9/1991 | Palanisamy | 320/20 |
| 5,049,804 | 9/1991 | Hutchings | 320/20 |
| 5,162,720 | 11/1992 | Lambert | 320/6 |
| 5,245,267 | 9/1993 | Pierret et al. | 320/15 |

Primary Examiner—Kenneth A. Wieder
Assistant Examiner—Glenn W. Brown
Attorney, Agent, or Firm—Davis Hoxie Faithfull & Hapgood

[57] ABSTRACT

A multi-battery charging system for reduced fuel consumption and emissions for an automotive vehicle. The system starts the vehicle with a start battery in a fuel saving manner, removing electrical torque from the alternator shaft, and allows a second (run) battery to provide all or some of the current required by the vehicle loads as a fuel savings measure. The start battery is recharged after start and switched out of the system fully charged for future vehicle starts. The run battery is recharged when its charge level drops below a predetermined level with an on board battery charging device powered from a 115 volt or 220 volt ac power line source external to the vehicle. The system also increases the alternator field current to charge the run battery during vehicle deceleration to use vehicle momentum to torque the alternator shaft, thus saving fuel. The system controls the alternator field current with a voltage regulator. The voltage regulator senses the charge level of the run and start batteries and vehicle operating conditions and provides the proper current into the alternator rotor for maximum fuel savings. The voltage regulator may be a non-microprocessor or a microprocessor controlled device.

34 Claims, 8 Drawing Sheets

DECELERATION CIRCUIT

MULTI-BATTERY CHARGING SYSTEM FOR REDUCED FUEL CONSUMPTION AND EMISSIONS IN AUTOMOTIVE VEHICLES

RELATED APPLICATIONS

This application is a continuation-in-part of U.S. patent application Ser. No. 07/919,011, filed Jul. 23, 1992, in the name of Wesley A. Rogers and entitled An Improved Battery State of Charge Monitor, which is a continuation-in-part of U.S. patent application Ser. No. 07/607,237, filed Oct. 31, 1990, in the name of Wesley A. Rogers and entitled Apparatus for Monitoring the State of Charge of a Battery, now issued as U.S. Pat. No. 5,179,340, which is a continuation-in-part of U.S. patent application Ser. No. 07/218,539, filed Jul. 13, 1988, in the name of Wesley A. Rogers and entitled Apparatus for Monitoring the State of Charge of a Battery, now issued as U.S. Pat. No. 4,968,941.

FIELD OF THE INVENTION

This invention relates to a multi-battery operating system for automotive vehicles that provides improved fuel economy and reduced emissions during operation and during starting, more particularly a three battery system having a start battery for starting the vehicle, a run battery for providing the vehicle load and accessory current, and a storage battery for preheating a catalytic converter during starting.

BACKGROUND OF THE INVENTION

In the normal operation of an automotive vehicle, a fully charged six cell battery having between 2.05 and 2.1 volts per cell (hereinafter referred to as a "start" battery) is used to start the engine and to operate accessory loads when the engine is not running. The conventional start battery is well suited to provide large start currents to the start motor on the order of 150 to 250 amperes.

The start battery is provided with thin plates between its individual cells that provides for a rapid, large current, shallow discharge during vehicle start. Unfortunately, the start battery cannot be deeply discharged in a repetitive manner without damaging the thin cell separator plates.

It has long been the practice to provide an alternator driven by the engine that can be used to recharge the start battery after vehicle start and provide current to both the vehicle run and accessory loads. It has also been the practice to maintain the alternator charging voltage at a nominal value of 14.0 volts at an ambient temperature of 85 degrees F. The nominal value is raised to 14.6 volts at minus 20 deg. F. and lowered to 13.6 volts at 140 deg. F. This provides adequate charge current as a function of ambient temperature and thereby extends battery life.

A voltage regulator is used to inject a controlled current into the alternator rotor. This in turn provides a controlled current in the stationary (stator) field coils. This in turn yields the rectified dc output voltage required for battery recharge after start and to supply the required vehicle load currents.

OBJECTS AND SUMMARY OF THE INVENTION

It has been realized by the inventor that the conventional operation of a start battery and alternator based electrical system of an automotive vehicle wastes energy. First, the alternator requires the engine to provide fuel consuming torque to operate the alternator at a nominal value, e.g., a 14.6 volt dc output level, in order to recharge the start battery and provide the required current to the vehicle loads. Second, the vehicle electronic circuits contain power consuming voltage regulator circuits that reduce the alternator output voltage to a 12 or 5 volt level. Third, the alternator places a mechanical torque on the engine as a function of the alternator output voltage and the current drawn to supply the load requirements and to charge the start battery. The fuel consumed by the engine to overcome the alternator counter torque is an unnecessary expense. Fourth, the vehicle engine and alternator are substantially less than 100% efficient and consume a correspondingly greater amount of fuel.

In addition, the inventor has realized that if the state of charge of the vehicle batteries are reliably and accurately determinable over their useful life it is possible to control the alternator output voltage, as required, either to charge the vehicle batteries or to allow one or more batteries to provide all the current required by the vehicle loads.

It is a further object of the invention to increase alternator output voltage during deceleration of an automotive vehicle, thereby using vehicle momentum to provide an increased torque load that is used to charge a battery.

It is another object of the invention to turn off selected vehicle accessory loads when the vehicle is parked and to turn off selected vehicle accessory loads when the state of charge of the battery providing current drops below a selected level.

It is another object of the invention to provide a storage battery for providing the current required to heat an electrically heated catalytic converter (EHC) during or prior to vehicle start when the engine temperature is below a selected level.

In accordance with the present invention, apparatus, systems, and methods are provided for providing sufficient electrical power to start and run an engine, to reduce the energy expended and fuel consumed and associated emission by-products in starting and running the engine, and optionally in operating a battery charging device to maintain a sufficient charge on each battery for the range of operating load conditions.

One aspect of the invention concerns a battery charging and run system for starting the engine of an automotive vehicle and operating the electrical loads of the automotive vehicle with improved fuel economy.

One embodiment of this aspect of the invention concerns a battery charging system for an automotive vehicle having:

- a start battery for use in starting the vehicle engine;
- a run battery for operating the vehicle accessory and non accessory loads;
- a battery charging device, such as an alternator, having a controllable output voltage when the vehicle is running;
- a first BSOC channel for monitoring the state of charge of the start of battery;
- a second BSOC channel for monitoring the state of charge of the run battery; and
- a first circuit, such as a voltage regulator, for controlling the output of the battery charging device to provide one of a first output voltage that varies in a first range as a function of ambient temperature when the sensed start battery state of charge level is below a first charge level and a second output voltage when the battery state of charge level is above the first charge level, a third output voltage to recharge the run battery when the run battery state of charge is below a second charge level, and a fourth output when the run battery state of charge is above the second charge level.

Preferably a switch is provided to switch the start battery out of the system after it is recharged. The switch is responsive to the sensed state of charge of the start battery and open circuits the start battery upon reaching the first charge level. In operation, the start battery is employed to start the vehicle engine. Its state of charge thus falls below the first charge level (corresponding to the prestart charge level). This causes the control circuit/voltage regulator to control the battery charging device to provide a first output voltage to recharge the start battery, e.g., between 16.4 and 13.6 volts dc, according to the ambient temperature in the conventional manner. When the sensed state of charge of the start battery is at the first charge level, the control circuit/voltage regulator may then control the battery charging device to provide the second output voltage level to maintain a full charge on the start battery. In a preferred embodiment, the switch is configured to respond automatically to the start battery state of charge returning to the first charge level and switch the start battery out of the charging system in a fully charged state. Alternatively, the switch may be manually operated by the operator who acts in response to a prompt, such as a light, audible tone, or battery state of charge display. When the start battery is switched out, the two battery system then may operate in one of two modes. In the first preferred mode of operation, the automotive vehicle electrical load is run off the run battery entirely. In this mode, once the start battery is switched out (and, as described below, an EHC battery is switched out), the control circuit controls the battery charging device to provide the fourth output by reducing the field current until the bridge rectifier diodes become back-biased. When the control circuit is a controllable voltage regulator, the battery charging device is an alternator, and the voltage regulator output into the alternator rotor coil is about zero, there is little, if any alternator counter torque on the engine and the rectified alternator output bridge diodes are backed biased and provide no current. Accordingly, the run battery will discharge to operate the vehicle load. During this discharge, the absence of the alternator counter torque results in improved fuel economy.

However, when the state of charge of the run battery falls to the second charge level, which corresponds to a low charge (deep discharge) level that will not damage the run battery, the control circuit/voltage regulator controls the battery charging device to provide the third output voltage. The third output voltage is then used to provide power for the vehicle load.

The third output voltage level may be selected as follows. It may be a level that will power the vehicle load and maintain the run battery at the second charge level. This selected level may be adjusted to prevent any further reduction in the state of charge of the run battery. In this case, the third output voltage may be on the order of 12 volts, as adjusted for ambient temperature conditions. Alternatively, the third output voltage may be a level that will power the vehicle level and recharge the run battery to a fully charged state, e.g., a voltage between 13 and 14.6 volts dc, as a function of ambient temperature. Once the run battery is recharged, it is allowed to discharge down to the second charge level, during which time the vehicle loads are again run exclusively off the run battery. Thus, whenever the alternator output voltage is reduced from the conventional full charging state, the alternator counter torque on the engine is less and there is improved fuel economy.

In all cases, the run battery is preferably recharged using a conventional battery charger which is powered from an external line source, e.g., a 220 or 115 volt ac line power supply. This permits replacing the amp-hour charge that was removed from the run battery by the vehicle loads with a source of electricity external to the vehicle. The external electricity source typically costs less per unit of energy than petroleum and alcohol based fuels and avoids consuming the incremental fuel that was saved during discharge of the run battery to generate the power needed to recharge the run battery. Such a battery charger may be mounted on or off the vehicle.

In another mode of operation, after the start battery and run batteries are recharged, the start battery is switched out and the battery charging device is operated to provide a fifth output voltage level and current for operating the vehicle accessory load. The fifth output voltage level is preferably selected to provide just enough current to operate the vehicle accessory loads, e.g., 12 volts for a 12-volt system and also applies a trickle charge current on the run battery. This mode also reduces the energy consumed as compared to prior voltage regulator start battery alternator systems that always produced more voltage than was required by the vehicle loads.

Switches and control circuits may be used to control automatically and/or manually the battery charging device and to connect selectively the battery charging device to one or both of the run and start batteries, and to provide the desired output voltage(s) and current(s) to recharge the batteries, singly or jointly, to operate the accessory and non accessory loads. A microprocessor may be used to control the various battery state of charge monitors, control circuits, and switches. Alternatively, a logic circuit network or a state machine comprising discrete and solid state components may be used as a control circuit. In addition, an operator display and manual switching system may be used.

Another aspect of this invention concerns providing a switch to connect one battery in place of the other battery if one of the batteries should fail to hold an adequate charge, and to use both batteries in parallel or in series when conditions so require. This is particularly useful in very cold weather when an additional source of start current is desired, and where one battery either fails or is not fully recharged before the engine is turned off.

Optionally, a measure of the amplitude and direction of the current flow into or out of the run battery or the start battery may be included for decision making purposes in selecting a voltage level. A large start battery discharge current may confirm a starting operation and raise the alternator output voltage level. An increased flow of current out of the run battery, i.e., a load current that might deplete charge from the run battery if the trickle charging voltage was maintained, could result in raising the trickle charging voltage, the load current and the battery state of charge.

Preferably, the start battery is a conventional automotive battery having thin cell plates and the run battery is a deep discharge, marine or cycle-proof battery. Such run batteries have thick cell plates and can be deep discharged to levels repeatedly, without seriously shortening their useful life. The thick plate construction also allows longer operation as an energy source than comparable thin cell plate starter batteries. However, run batteries typically cannot develop the high discharge currents suitable for starting the engine of an automotive vehicle. Other types of run batteries which are capable of repeated deep discharge are becoming available and may be used. For example, Ford Motor Company has announced such a high charge storage run battery for use in its forthcoming electric vehicle. Other batteries, such as sodium sulphur batteries having increased amp-hour ratings, as compared to lead acid batteries, also may be used. Further, when deemed appropriate, the size of run battery 20 may be reduced to a five cell battery to have a 12 volt rating or increased to 24–25 volt with a DC/DC convertor to increase the time for running off run battery 20, and to reduce the size of the alternator.

Advantageously also, it has been discovered that a fuel and cost savings can be achieved by the reduced alternator mechanical load on the engine and lower fuel consumption whenever, and to the extent that, the alternator field current is decreased to back bias the output rectifier diodes. Another advantage results from recharging a discharged battery using lower cost electricity from a source external to the vehicle.

Preferably, the state of charge of each battery used is monitored by a battery state of charge (BSOC) monitoring circuit channel. Any device capable of reliably integrating the net charge over time may be used. Preferably, the BSOC circuit includes a section of the battery return cable as a shunt or a shunt resistor in series with the battery negative terminal and a circuit having a very large capacitance for integrating the current through the shunt continuously. See i.e., the circuits disclosed in the aforementioned U.S. Pat. Nos. 4,968,941 and 5,179,340 and copending and commonly assigned U.S. patent application Ser. No. 07/919,011, which patents and application are expressly incorporated herein by reference in their entirety.

Another aspect of the invention concerns apparatus and methods for controlling the charging voltage level applied to a battery in an automotive vehicle in response to the deceleration of the vehicle. Broadly, this aspect of the invention concerns sensing the deceleration of a vehicle and causing the battery charging device to produce a high level charging voltage for rapidly recharging a battery during deceleration. When the vehicle is decelerating, the alternator is driven by the momentum of the vehicle turning the wheels, drive shaft, and, hence, the engine, and not by the engine burning fuel. Thus, during deceleration some of the energy stored in the momentum of the vehicle can be converted by the alternator to energy which is stored in the run battery.

Accordingly, during deceleration events, the control current to the alternator rotor is increased. This raises the alternator output voltage and results in an increased resistance to rotation of the alternator rotor coil. As a result, the charge on the battery is rapidly increased without consuming incremental fuel to do so. Another advantage is that the increased alternator counter torque load on the engine aids in slowing the vehicle without increased brake wear or effort.

The deceleration feature is particularly useful in stop and go traffic such that the battery charging device is turned off during steady state and accelerating driving conditions and is turned on to provide a high charging voltage during deceleration. The recharging during each deceleration will effectively prolong the time the vehicle can operate solely off the run battery. It also is useful when operating the battery charging device at a charging voltage just to maintain a charge on the run battery, for recharging start batteries, whether in the two battery charging system or a single battery charging system.

During the onset of deceleration, it may be desirable to ramp the control signal to raise the battery charging device output to a high voltage to minimize slippage and wear on the alternator. A switch may be provided to disable temporarily the deceleration feature when desired so that, for example, a driver can coast.

The various aspects of the invention are not limited to battery charging systems for automotive vehicles. They are applicable to any apparatus having a start battery that consumes energy to charge an electrical energy storage device that is connected to operate an electrical load or device, including without limitation, electrically starting combustion engines such as a generator for household (or industrial) current, a gas operated lawn mower, a powered vehicle or device, aircraft, spacecraft, watercraft, emergency lighting or power plants.

A further aspect of the invention provides a battery which provides a very high current to a heating coil of an electrically heated catalytic converter (EHC) unit which performs the emission control functions of a standard catalytic converter that is heated by the engine. This battery is referred to as an "EHC" battery or a "storage" battery. The EHC unit may be a small catalytic converter that is placed in series with a standard catalytic converter, or it may be incorporated into an otherwise standard catalytic converter by, for example, the introduction of suitable heating coils as a part of the catalytic converter unit.

In operation, the EHC battery is switched, for about 20 seconds, to the EHC unit heater coil during the vehicle start operation. This provides a very high discharge current at a selected level, on the order of 500 to 650 amps, preferably 600 amps. The current discharge is high enough for the heater coil to heat rapidly at the EHC unit to its effective operating temperature and maintain it there during the heating period. The EHC battery may be disconnected after a preset time period, after the engine temperature exceeds a selected threshold, or when the state of charge of the EHC battery falls to a selected charge level. Further, the EHC battery may be switched to the EHC heater until the engine temperature is suitably high. This provides for preheating the catalytic converter so that it reaches an effective operating temperature sooner than conventional catalytic converter systems, which rely solely on engine temperature to heat the catalytic converter. Advantageously, by preheating the catalytic converter electrically, vehicle emissions are substantially reduced during vehicle starting, particularly in cold operating conditions. A third BSOC circuit channel could be used to monitor the EHC battery state of charge. If a BSOC channel is used, the control circuit is preferably responsive to the sensed EHC battery state of change (with appropriate switches) to recharge the EHC battery if its charge level is below the predetermined level. Provision also is made to recharge the EHC battery with an on or off-board battery charger from a source of 220 or 115 volt ac line power.

Furthermore, the EHC battery may be periodically switched to the EHC heater coil during operating conditions whenever the engine operating temperature is insufficient to heat the catalytic converter to its effective operating condition. This mode of operation may be selectively enabled or disabled, and the EHC battery may be recharged whenever its state of charge falls below a selected charge threshold.

Although each of the EHC battery system, the two-battery charge system, and the deceleration recharging system may be used separately, they are preferably combined to provide a more fuel efficient and reduced emission automotive vehicle.

BRIEF DESCRIPTION OF THE DRAWINGS

Further features of the invention, its nature and various advantages will be more apparent from the accompanying drawings and the following detailed description of the invention, in which like reference numerals refer to like elements, and in which.

DETAILED DESCRIPTION OF THE INVENTION

Figure 1:
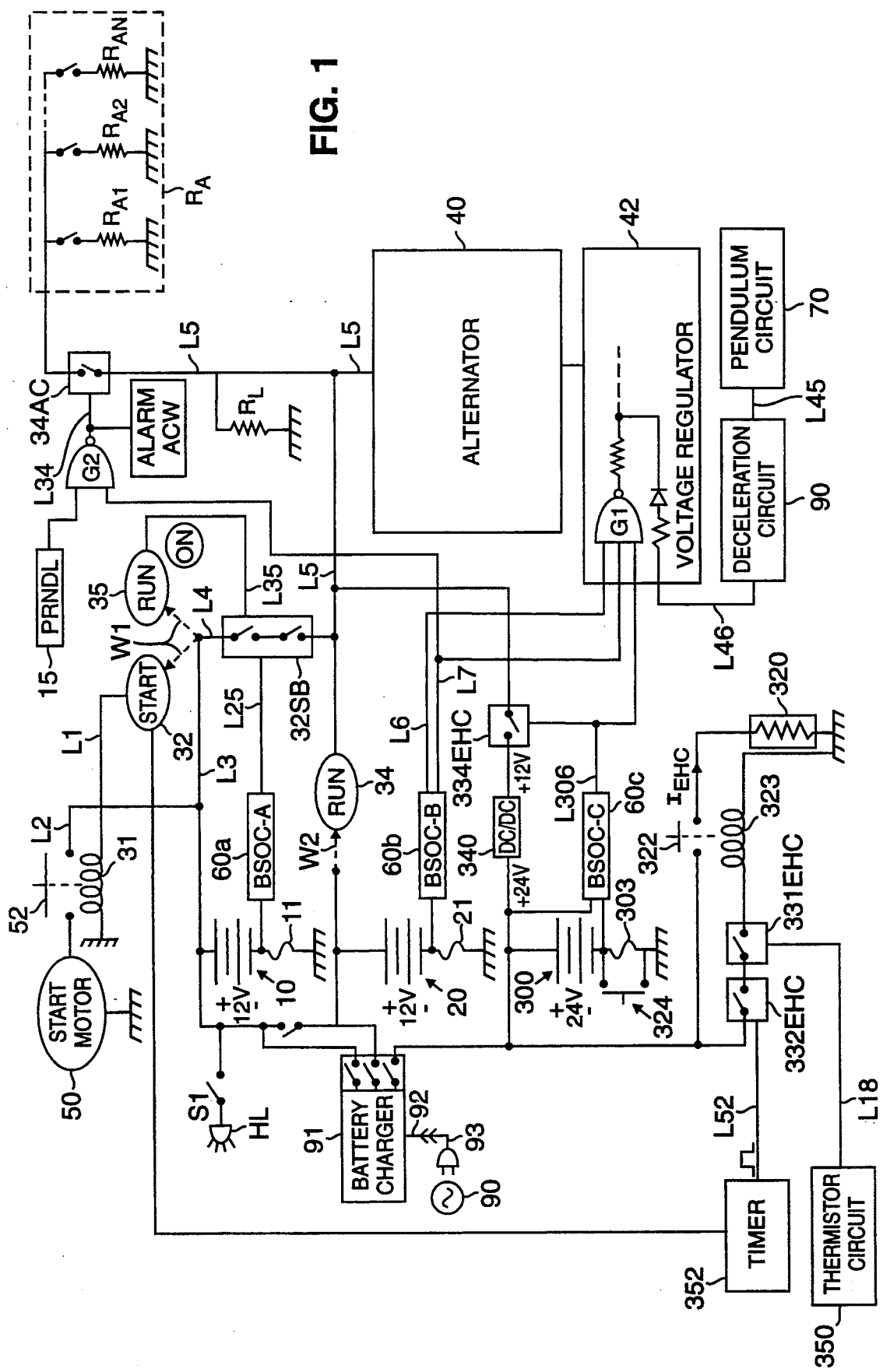
FIG. 1 is a block diagram of a non-microprocessor controlled three battery fuel saving and reduced emission operating and battery charging system in accordance with a first embodiment of the invention.

Referring to FIG. 1, an apparatus for a three battery charging system in accordance with a first embodiment of the present invention is shown. The apparatus includes a start battery 10, a run battery 20, an EHC battery 300, battery state of charge (BSOC) channels 60a, 60b, and 60c, an alternator 40, a voltage regulator 42, a pendulum circuit 70 and vehicle deceleration circuit 90, and an ignition switch 30 including ganged wipers W1, W2, W3 and W4. When wiper W1 of ignition switch 30 is placed in the start position at contact 32, current is provided from start battery 10 on line L1 to start solenoid 31. Start solenoid 31 is thus energized and closes contact 52. This switches start battery 10 to start motor 50 on line L2 and provides the required current to turn over start motor 50.

When the engine (not shown) starts, wiper W1 is conventionally returned to the run position, contact 35. A signal is then applied from start battery 10 on line L3 through wiper W1 and line L35 that turns on a solid state switch 32SB. When start battery 10 is less than fully charged, the BSOC channel 60a output on line L25 is low and switch 32SB is conducting. Solid state switch 32SB connects start battery 10 to the output of alternator 40 on line L5. This allows alternator 40 to recharge start battery 10. When start battery 10 is recharged the output voltage on line L25 from BSOC channel 60a switches to high. A high signal on line L25 turns switch 32SB off, thus disconnecting fully charged start battery 10 from the system. A fully charged start battery 10 is one that has an arbitrary high percentage of its actual full charge, e.g., 90% of full charge.

In the run position, wiper W2 of ignition switch 30 is at contact 34. This connects run battery 20 to output line L5 of alternator 40, to vehicle run load $R_L$, and to vehicle accessory load $R_A$ through solid state accessory switch 34ac. In this condition, run battery 20 is being recharged by alternator 40, in the event that it happened to be partially discharged, and vehicle loads $R_L$ are placed across the output L5 of alternator 40. For maximum safety, the vehicle lamps, illustrated as HL, are connected directly off both the run and start batteries 10 and 20 through manual switch S1.

Switch 34AC is controlled by a NAND Gate G2 which receives one input from a "park" position indicator 15 corresponding to the vehicle being parked (a logical high state), e.g., the shift lever being in the park position in a vehicle having an automatic transmission. The second input is from the BSOC channel 60b output line L7, which indicates when the state of charge of run battery 20 is above (logical high state) or below (logical low state) the second predetermined charge level. Thus, when the vehicle is not in park and the run battery 20 state of charge is above the preselected charge level, switch 34AC is closed and accessory circuits $R_A$ are switched to battery 20. Otherwise, switch 34AC is open and circuits $R_A$ are switched out. In this embodiment, accessory circuits $R_A$ are noncritical accessory devices the loss of which will not impair driving safety. A warning alarm device ACW is connected to the output of NAND gate G2 to produce a visual or audible alarm when switch 34AC switches out accessory circuits $R_A$. Critical accessory loads are always connectable to a battery and manually operable, e.g., headlights.

When run battery 20 has been recharged in accordance with ambient temperature requirements, the output voltage on line L6 from BSOC channel 60b switches from a low state to a high state. BSOC channel 60b also has output line L7 which indicates, by changing from high to low states, when run battery 20 discharges below a preselected charge level.

When EHC battery 300 is fully recharged, the signal on output line L306 from BSOC channel 60c switches from a low state to a high state. At this event, the three signals on lines L6, L7 and L306, which are inputs to logic NAND gate G1, are in the high state. NAND gate G1 is a part of voltage regulator 42 (see FIG. 6) of which only a portion is illustrated in FIG. 1. (If no BSOC channel 60c is used, NAND gate G1 may have only two inputs, i.e., lines L6 and L7.)

Figure 6:
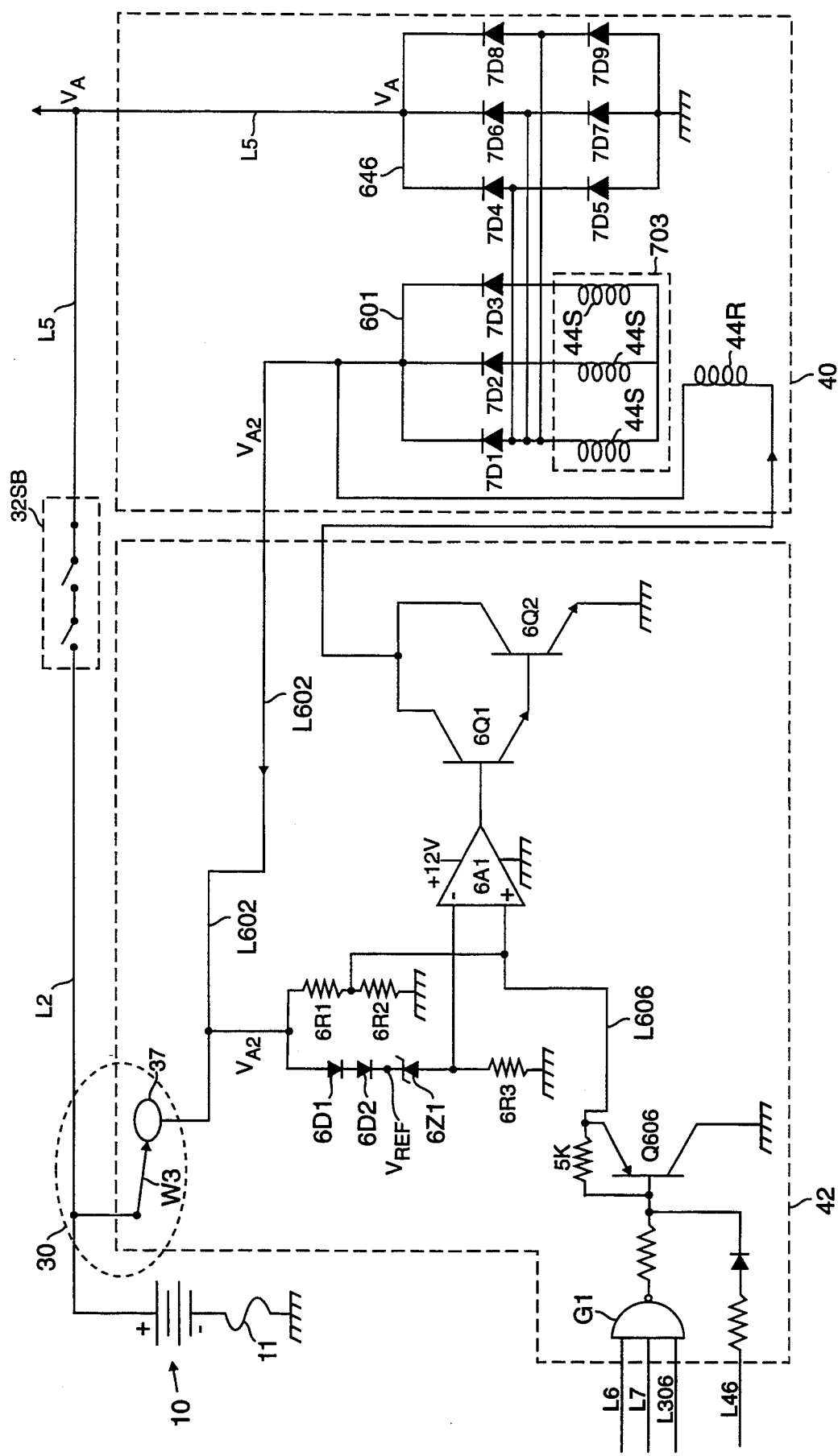
FIG. 6 is a circuit diagram of the non-microprocessor controlled voltage regulator and alternator of FIG. 1.

Referring to FIGS. 1 and 6, the above set of high state input conditions causes the output of NAND gate G1 in voltage regulator 42 to switch to the low state. This reduces the field current $I_f$ in alternator 40 to zero and back biases the bridge rectifier output diodes. This prevents alternator 40 from delivering current to output line L5, which connects to run battery 20 and the vehicle loads $R_L$ and accessory circuits $R_A$. With alternator 40 unable to provide current to line L5, run battery 20 is required to provide all the current to the vehicle loads $R_L$ and $R_A$ until run battery 20 discharges to a predetermined level. When this occurs, the voltage on output line L7 from BSOC channel 60b drops from a high to a low state. A low state on line L7 causes the output of NAND gate G1 to switch to the high state, thus increasing the field current $I_F$ of alternator 40 from zero to its normal operating level. This forward biases the rectifier diodes. Alternator 40 is now able to recharge run battery 20 and provide the load current required to operate the vehicle. During this time, switch 34AC will remain closed when the vehicle is not in park and the run battery is above a predetermined charge level.

In summary, the following task sequence is accomplished by the system:
1) started the vehicle with start battery 10 when ignition switch 30 was placed in the start position;
2) recharged start battery 10 to its original state, recharged run battery 20, if necessary, and recharged EHC battery 300 after it has provided a 20 second duration 600 amp heater current to an electrically heated catalytic converter (EHC) 320;
3) switched the alternator 40 out of the system after recharging batteries 10, 20, and 30 by reducing field current $I_F$ to zero, thus preventing it from generating current to output line L5;
4) allowed the run battery 20 to provide all the current required on line L5 to operate vehicle loads $R_L$ and $R_A$ under all operating conditions (except as noted);
5) switched alternator 40 back into the system after run battery 20 was discharged to a predetermined level by the vehicle loads $R_L$ and $R_A$; and
6) recharged the run battery 20 and provided required load currents with alternator 40 in its normal operating state until an external power source can be obtained.

Preferably, run battery 20 is recharged as soon as possible with a conventional battery charger 91, also referred to as a "line power charger", which is optimally mounted on board the vehicle, after the charge level of run battery 20 drops to the predetermined charge level where a recharge is required. The normal battery recharge procedure from a conventional external 115 or 220 volt power outlet 90 would be to connect a power cord 93 between outlet 90 and a vehicle connector 92 and provide battery charge current with on board battery charger 91.

Run battery 20 may be recharged using alternator 40 when an external source is not available. However, this essentially eliminates the fuel and cost savings obtained by using run battery 20 to power the vehicle loads $R_L$ and $R_A$. The output line L7 of BSOC channel 60b may be used to provide a recharge warning signal for a display located on the instrument panel, e.g., illuminating a lamp, tone generator, or other indicator (not shown). This warning signal advises the vehicle operator that run battery 20 requires a recharge and that an external wayside or garage power outlet 90 should be located to recharge run battery 20 as soon as possible. Alternately, the recharge warning would be activated based on a charge level that is above the predetermined charge level or which causes output line L7 to switch to a low state, thus giving the operator time to locate a power supply before alternator 40 is automatically switched in to recharge run battery 20. Further, a charge level gauge, similar to a fuel gauge, could be used to display the state of charge of one or more batteries.

Non-Microprocessor Three Battery Version

Advantageously, a considerable emissions reduction can be realized by heating a small insulated electrically heated converter (EHC) that operates in series with the conventional catalytic converter (not shown) or a standard catalytic converter, collectively illustrated as EHC heater coil 320 in FIG. 1. The problem with heating the EHC coil 320 during start with conventional battery charging systems that have only a start battery is that approximately 600 amperes of current is drawn from the battery during and after start for approximately 20 seconds. This current load would prevent start motor 50 from turning over.

It has been realized by the inventor that by using a dedicated heater storage battery, e.g., EHC battery 300, a 600 ampere current draw for twenty seconds reduces the amp-hour charge level in such a battery by only four amp-hours. It also has been realized by the inventor that a 24 volt 120 amp-hour very high discharge EHC battery 300 can produce such a four amp-hour charge, which charge can be replaced by a normal alternator 40 or by an externally powered battery charger 91, in a relatively short period of time, e.g., between ten to forty minutes, more typically about fifteen minutes.

Both the non microprocessor and microprocessor based systems described herein can be configured to either recharge EHC heater battery 300 after each 20 second heating period during vehicle start, or allow EHC battery 300 to be deeply discharged (i.e., down to a preselected charge level) before recharging it, preferably from an external power line source 90, or from alternator 40.

The EHC heater system of the present invention also could be used to inhibit vehicle start for 15 seconds, as is done with diesel engine vehicles to preheat the glow plugs, to apply a preheat to the EHC coil 320 for this period and for a 3 to 5 second period after start. The Table I below indicates the relatively reduced emission levels obtained during vehicle start with normal operation and with the preheat operation of the EHC 320.

TABLE I

| Preheat Time seconds | Post Heat Time | Hydrocarbons grams/mile | Carbon Monoxide grams/mile |
|---|---|---|---|
| 0 | 18 | 0.025 | 0.5 |
| 15 | 3 | 0.017 | 0.42 |

In comparison, the emission levels during start when the same vehicle engine is at ambient temperature are: 1 gram of hydrocarbons per mile, and 29 grams of carbon monoxide per mile. Thus, during the period until the vehicle engine temperature reaches the steady state temperature level where the conventional catalytic converter properly functions, the EHC battery 300 and coil 320 provide for substantially reduced emissions.

EHC Battery Control System

When wiper W1 of ignition switch 30 is turned to the start position at contact 32, a high state voltage turn-on signal is sent to a timer circuit 352. The turn-on signal initiates a twenty second output pulse on output L52 of timer 352. The twenty second pulse has a high state which turns on a solid state switch 332EHC for the duration of the twenty second period.

At this time, the engine temperature is monitored by a thermistor circuit 350. Circuit 350 provides a low state output voltage when the engine temperature is below a predetermined level which is not high enough to heat sufficiently the catalytic converter and a high state output voltage when the engine temperature is above the predetermined level, e.g., 500° F. In the instance where the engine temperature is low, engine thermistor circuit 350 sends a low state signal on output line L18 to solid state switch 331EHC, which turns switch 331EHC on. Assuming that the twenty second period has not ended, this completes the path for current flow from EHC battery 300 which energizes EHC solenoid coil 323. The solenoid coil 323 pulls in contacts 322 and 324 which are ganged together. EHC battery 300 is preferably a 24 volt battery and closing contact 322 delivers 600 amperes of current ($I_{EHC}$) to EHC heater coil 320. Closing contact 324 shorts the shunt 303 in series with battery 300 to avoid over heating shunt 303 during the period that battery 300 is delivering 600 amperes. When shunt 303 is a length of wire between two contact pins, or when no BSOC channel 60c is used, contact 324 may be omitted.

At the end of the twenty (20) second timing period, the output voltage on output line L52 of timer 352 drops from a high to a low state. Consequently, solid state switch 332EHC is turned off and contacts 322 and 324 both open. This removes the EHC heater current $I_{EHC}$ to coil 323 and switches out battery 300.

In the event that the engine temperature is above the predetermined level, it is not necessary to apply heater current to EHC heater coil 320. In this case, although the output voltage from timer circuit 352 on line L52 is in the high state (during the pulse period) and switch 332EHC is on, solid state switch 331EHC is turned off. This inhibits current flow to solenoid 323 and leaves contact 322 open.

The release of contact 324 also places shunt 303 to EHC battery 300 in the line. The voltage across shunt 303 can therefore be monitored during recharge of battery 300 by BSOC channel 60c to determine when battery 300 is fully charged (e.g., when a 4 amp-hour charge per EHC 320 heating event has been restored), and apply a high state input to NAND gate G1 in voltage regulator 42. Because the load current drawn from EHC battery 300 by coil 320 and the time period are known, the amp-hour charge lost can be simulated by a suitable "start" circuit in BSOC channel 60c, which removes an amount of charge from the BSOC integrator capacitive storage element corresponding to the heater current delivered. Alternately, BSOC channel 60c may simply measure when either a 4 amp-hour recharge has been delivered or the charging current to battery 300 has dropped to a trickle charge, after each start operation.

The high state voltage output line L306 from BSOC channel 60c also is transmitted to solid state switch 334EHC which turns it on and allows the recharge from alternator 40 to be stepped up by circuit 340 from 12 volts dc to 24 or 25 volts dc, in order to recharge EHC battery 300.

Module Circuit Descriptions

Figure 2:
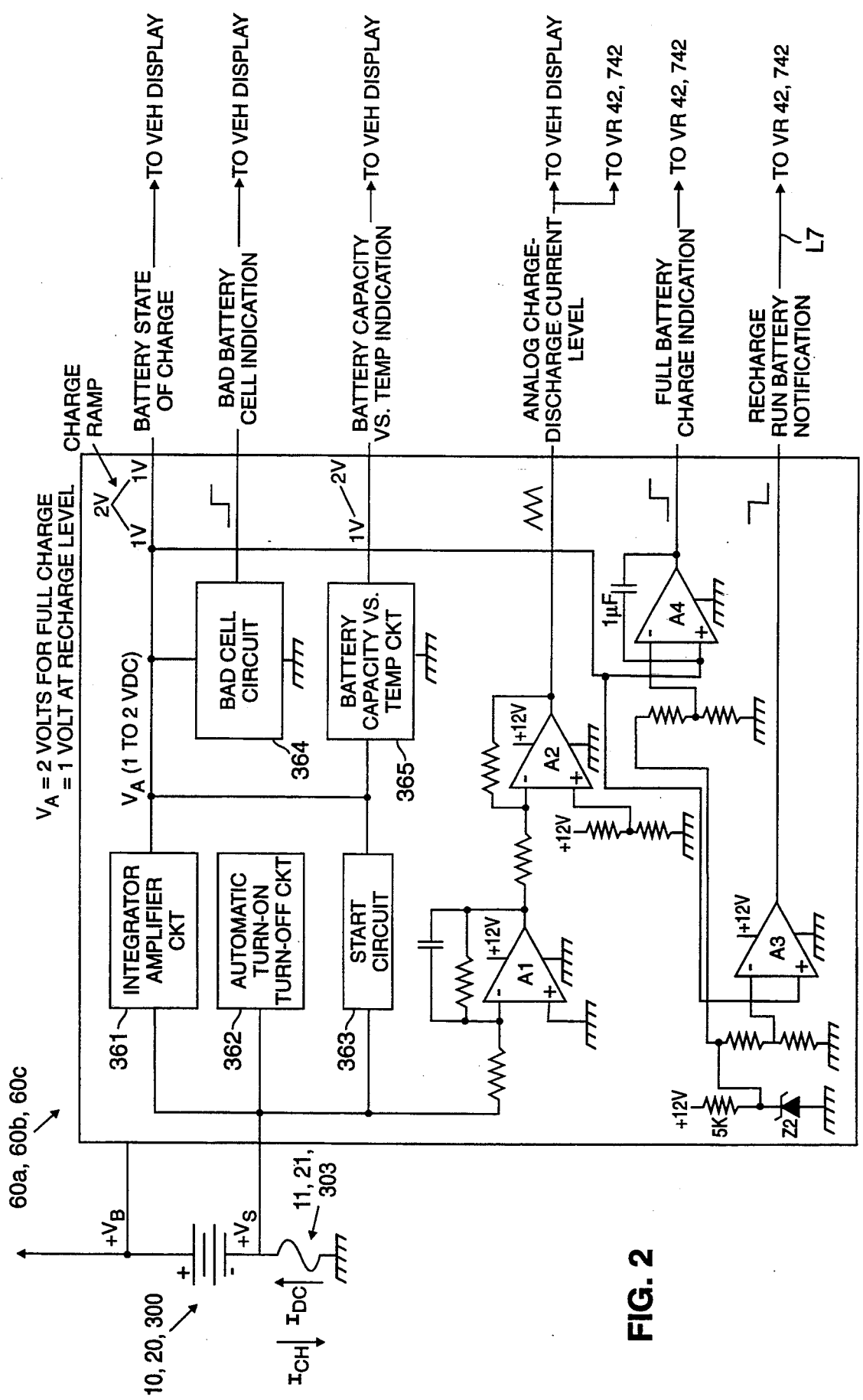
FIG. 2 is a circuit diagram of a battery state of charge circuit of FIGS. 1 and 7.

FIG. 2 illustrates a schematic of the battery state of charge circuit channels 60a, 60b and 60c, which are preferably identical. The circuits shown on the schematic of FIG. 2, except current monitoring amplifiers A1 through A4, may be constructed as described in the aforementioned U.S. Pat. Nos. 4,968,940, and 5,179,340 and application Ser. No. 07/919,011.

The integrator amplifier 361 in each BSOC channel is an analog type that integrates the battery charge current $I_{CH}$ and discharge current $I_{DC}$ through its shunt (i.e., shunts 11, 21 and 303 and shown in FIG. 1), over time. The voltage drop $V_S$ across the shunt is proportional to the current flowing through it. An arbitrary shunt may be selected, e.g., to produce 2.3 millivolts per amp of current, more preferably, a length of battery return cable between two contact pins. A battery charging current $I_{CH}$ through the shunt produces a positive output voltage $V_S$ and a discharge current $I_{DC}$ produces a negative $V_S$ as illustrated in FIG. 2.

A positive voltage $V_S$ causes the integrator output $V_A$ to rise as the battery charges. A negative $V_S$ causes $V_A$ to drop in the negative direction over time as the battery discharges. The battery state of charge can therefore be displayed on a meter in the same manner as a fuel gauge displays the amount of fuel in the tank. Any type of integrator, including digital types, will operate equally well in the circuit.

The integration slope of each integrator circuit 361 has been arbitrarily established to provide a 2 volt dc output signal to the vehicle display on the output line (lines L361, L362 and L363) when its battery (batteries 10, 20 or 300, respectively, in FIG. 1) is fully charged and an arbitrary low voltage output when the associated battery charge drops to a level where a recharge is required.

The integrator output voltage $V_A$ ramps up and down very slowly over time and therefore cannot be easily used to operate circuit devices that perform command functions etc. Consequently, it is necessary to employ switching circuits that either rise from a low to a high voltage or drop from a high to low voltage when the output voltage $V_A$ is at predetermined points on the rising or falling voltage ramp as the battery is being charged or discharged.

Amplifier A4 switches from zero volts to 10 volts dc when the battery is fully charged and the integrator output voltage $V_A$ is 2 volts dc. This signals voltage regulator 42 (FIGS. 1, 6) that the battery being monitored is fully charged.

Amplifier A3 switches from 10 volts dc to 0 volts when the state of the battery being monitored drops to an arbitrary, e.g., 50% for a run battery 20, discharge level. This occurs when the integrator output voltage $V_A$ drops to 1 volt dc. This signals voltage regulator 42 that a battery is discharged to the point where alternator 40 must be used to recharge it.

Amplifiers A1 and A2 provide a dc output voltage proportional to the charge and discharge currents through the shunt. These currents vary quite rapidly and consequently produce a rapidly changing positive and negative going output voltage at the output of A2. The integrator smooths these rapid changes over time and thus provides a slowly moving output voltage $V_A$.

The current amplifiers are used to provide display information that indicates the direction and magnitude of current flow into and out of the batteries. The output of amplifier A4 could be used to provide an indication of battery charge level if desired. The charge current $I_{CH}$ into a battery from alternator 40 is very high, approximately 30 amps at the start of recharge, and drops to a level of approximately 2 to 3 amperes when the battery is fully charged. The shunt voltages $V_S$ corresponding to these currents could therefore be monitored by amplifier A1 and the output voltage of amplifier A4 used to indicate full battery charge to voltage regulator 42 in FIG. 1 if desired.

Bad battery cell circuit 364 switches from a zero output voltage to 10 volts dc in the event that the battery being monitored has a bad cell. The operation of this circuit is explained in the referenced patent applications.

The automatic turn on—turn off circuit 362 senses when a small charge or discharge current produces a small positive or negative voltage $V_S$ across the battery current shunt and applies battery voltage (e.g., 12 volts) to all the battery state of charge channel circuits. In the turn off state (standby state) each BSOC channel 60 draws approximately 1 milliampere from the battery, e.g., run battery 20. This allows the BSOC channel 60 to be permanently wired to the battery terminals. When the BSOC channel senses current through the battery, the turn on circuit 362 energizes an internal BSOC power supply that provides approximately 50 milliamperes of current from the battery to the remainder of the BSOC channel circuits.

Battery capacity versus temperature circuit 365 provides a signal corresponding to the change in battery capacity with sensed ambient temperature. This is a conventional circuit that is commonly used in existing voltage regulator systems.

Start circuit 363 ensures, during vehicle start, that the integrator amplifier 361 of BSOC channel 60a measures the proper amount of charge removed from start battery 10 by starter motor 50. In the case that shunt 303 is a resistor in series with EHC battery 300, a similar start circuit 363 may be used to simulate the discharge of current across shorted shunt 303 for EHC battery 300 so that integrator amplifier circuit 361 of BSOC channel 60c measures the proper amount of charge removed from battery 300 by EHC coil 320.

Figure 3A:
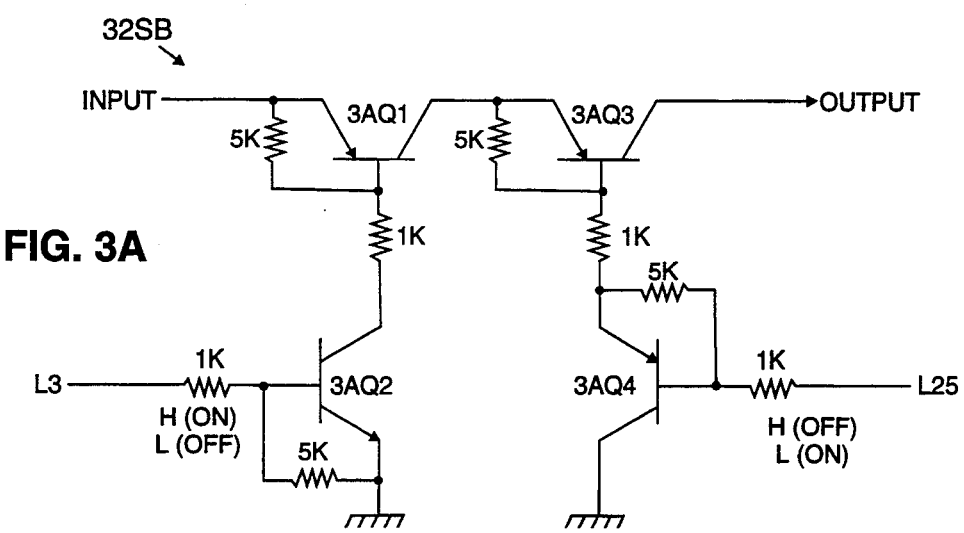
FIG. 3A is a circuit and schematic of a first solid state switch of FIGS. 1 and 7.

Referring to FIG. 3A, solid state start battery switch 32SB, includes two pnp transistors 3AQ1 and 3AQ3 which are in the on state when both npn transistors 3AQ2 and A3Q4 are conducting. This occurs when the input on line L3 (i.e., the input from wiper W1 of ignition switch 30) is high and the input on line L25 (i.e., the output from BSOC channel 60a) is low. Switch 32SB is off for all other input conditions.

Figure 3B:
FIG. 3B is a circuit and schematic of a second solid state switch of FIGS. 1 and 7.

Referring to FIG. 3B, solid switches 332EHC and 34AC each include a pnp transistor 3BQ1, which is in the conducting state when npn transistor 3BQ2 is conducting. This occurs when the respective input, line L52 from timer circuit 352 or line L34 from NAND gate G2, is high.

Figure 3C:
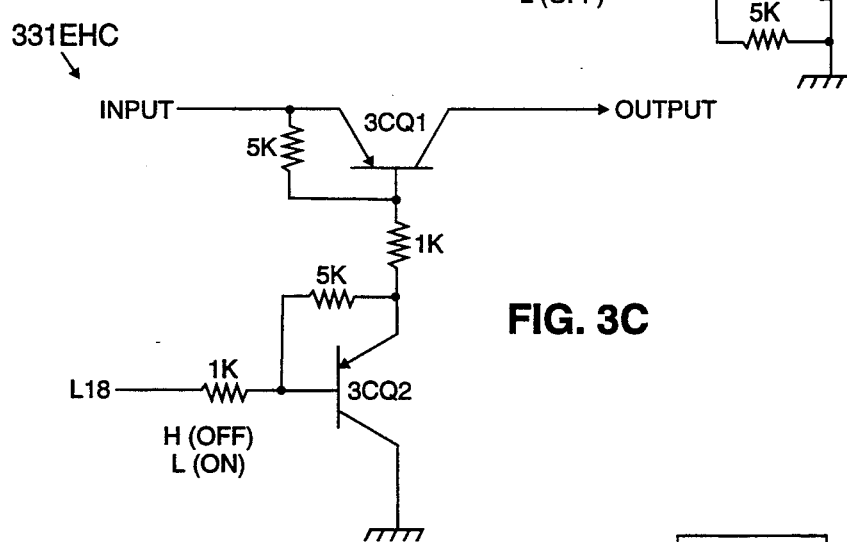
FIG. 3C is a circuit and schematic of a third solid state switch of FIGS. 1 and 7.

Referring to FIG. 3C, solid state switch 331EHC includes transistor 3CQ1 which is in the on state when transistor 3CQ2 is conducting. This occurs when the input on line L18 from engine thermistor circuit 350 is low.

Figure 4:
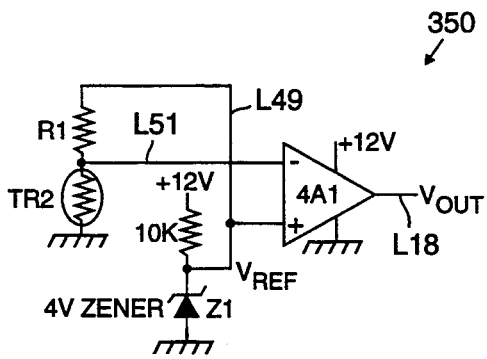
FIG. 4 is a circuit diagram of the thermistor circuits of FIGS. 1 and 2.

Engine thermistor switching circuit 350 is shown in FIG. 4. Circuit 350 senses the temperature of the engine housing near the electrically heated catalytic converter. The thermistor TR2 is a negative coefficient type device having a series resistance that reduces as engine temperature rises. When the engine temperature has reached a predetermined level, the resistance of thermistor TR2 drops to the point where the voltage on line L51 drops below the reference voltage on line L49. This causes the output line L18 of operational amplifier 4A1 to switch from a low to a high voltage state. The reference voltage may be provided in any manner, e.g., a voltage divider between a +12 volt source across a 10 kΩ resistor and a 4 v zener diode as illustrated in FIG. 4.

Figure 5:
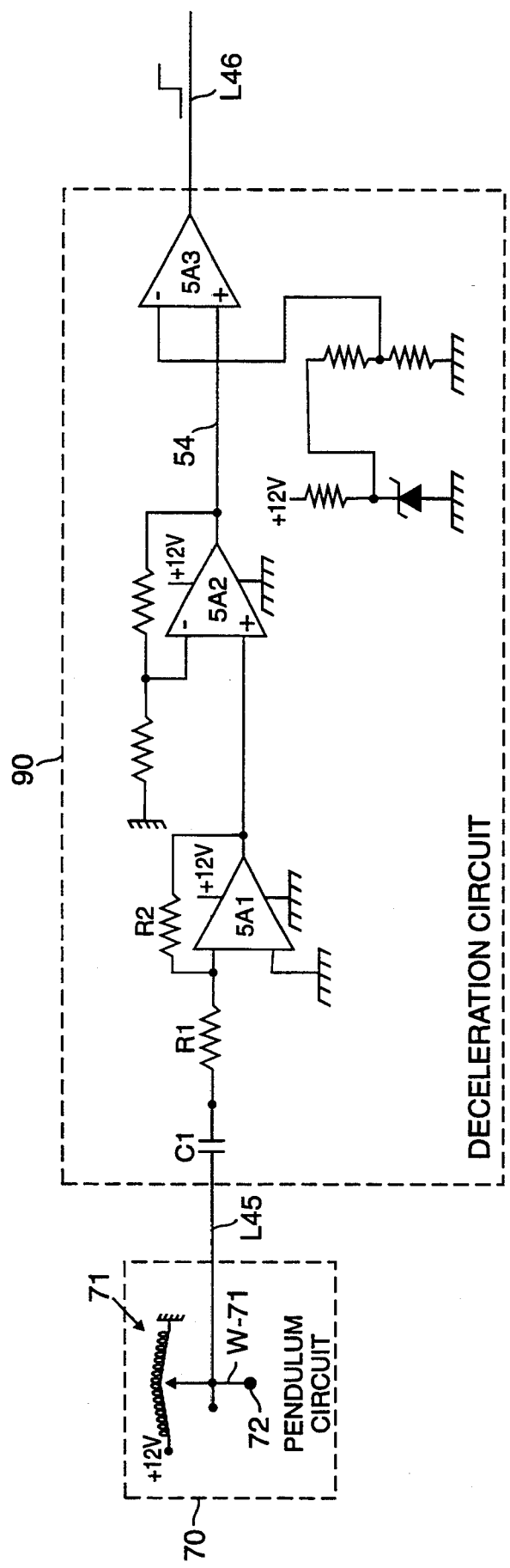
FIG. 5 is a circuit diagram of the deceleration circuit shown in FIG. 1.

Pendulum circuit 70, shown in FIGS. 1 and 5, includes a potentiometer 71 having its wiper W-71 operated by a pendulum 72. When the vehicle decelerates, pendulum 72 swings in the "vehicle forward" direction and moves wiper W-71 of potentiometer 71 in a direction that produces a sudden change, e.g., an increase in both the rate of change and magnitude of the voltage output on line L45. The sudden change in magnitude and rise time of the voltage on line L45 is sensed by deceleration circuit 90 and the output voltage on output line L46 switches from a low state to a high state output voltage.

Proper selection of the resistive and capacitor components in deceleration circuit 90 will cause the output of switching amplifier 5A3 to switch when vehicle deceleration exceeds any predetermined rate. In this regard, capacitor C1, resistors R1 and R2 and amplifier 5A1 comprise a conventional differentiator circuit that will not produce an output voltage unless the vehicle decelerates at a rate greater than a predetermined level. The magnitude of the voltage at the output of amplifier 5A1 is given by:

$$Eout = R1 \times C1 \times (E2-E1)/(t2-t1)$$

Proper selection of component values in the differentiating equation will produce an output voltage having the proper magnitude for a predetermined vehicle deceleration rate.

The voltage at the output of amplifier 5A1 is amplified by amplifier 5A2 and applied to the non-inverting input of amplifier 5A3. When the applied voltage exceeds the reference voltage provided on the inverting input of amplifier 5A3, amplifier 5A3 switches from a low state to a high state.

Alternately, pendulum circuit 70 can be replaced with any type of vehicle deceleration detection circuit device, including wheel speed pickoff types, that can be modified to provide an output voltage having a magnitude and rise time sufficiently proportional to vehicle deceleration to operate with deceleration circuit 90.

Referring now to FIG. 6, voltage regulator 42, in accordance with the non-microprocessor controlled version of the present invention, is similar to many off-the-shelf type of voltage regulators that control the magnitude of the output voltage $V_A$ of alternator 40. The regulation principle is well known and has been in use almost as long as the automobile has been in existence. Early voltage regulator circuits sensed the level of the output voltage $V_A$ from the alternator 40 and commanded a relay contact to remain closed for a longer period of time than open when the output voltage $V_A$ was below a preset level, such as 14.0 volts dc. When the sensed output voltage $V_A$ was above the reference level, the contact was commanded to remain open for a longer period of time than closed. This switching action maintained the output voltage $V_A$ in the vicinity of 13.6 volts dc in a reasonable manner.

The voltage regulator circuit also sensed the ambient temperature and modified the on-off switching time as a function of temperature. It also modified the switching on-off time to cause the contact to remain on for a slightly longer period when ambient temperature was low and to remain off for a slightly longer period of time when the ambient temperature was high. This raised alternator nominal 14.0 volt dc output level to 14.8 volts at low temperatures and reduced the nominal 14.0 volt output to 13.6 volts dc at high ambient temperatures. The nominal output voltage, when raised to 14.8 volts dc, provided more current to the alternator rotor coil 44R at low ambient temperatures and less current when it was reduced to 13.6 volts at high ambient temperatures, thus maintaining a proper charging current to the start battery under all driving and ambient temperature conditions.

Relay contact controlled voltage regulators have been replaced with more reliable transistor switching types that control the alternator rotor, and thus field current, in much the same manner as described above, i.e., by changing the duty cycle of the current.

In accordance with the present invention, referring to FIG. 6, voltage regulator 42 includes an on-off switching circuit comprised of a logic NAND gate G1, a pnp transistor Q606, temperature sensitive diodes 6D1, 6D2, zener diode 6Z1, operational amplifier 6A1, voltage divider resistors 6R1, 6R2 and darlington power switching transistors 6Q1 and 6Q2.

When wiper W3 of ignition switch 30 is placed in the run position (contact 37) prior to start, an exciter current from start battery 10 is delivered through rotor coil 44R of alternator 40 and series transistor 6Q2 to ground. This provides sufficient current to overcome the residual magnetism in rotor coil 44R which allows coil 44R to develop the required current to operate properly alternator 40.

There are a variety of solid state switching voltage regulators in operation at the present time. Most of them can be activated and deactivated to switch the current into rotor 44R on and off by grounding a key signal line in the circuit. This can be manually done with a switch and automatically done with inputs of the type illustrated in FIGS. 1 and 6 or with a microprocessor.

When the output voltage $V_A$ of alternator 40 is below a nominal 14.0 volt dc level, zener diode 6Z1 does not conduct current. Consequently, the voltage at its base on top of resistor 6R3 is zero. The sensed alternator output voltage $V_A$ is, however, present at the non-inverting input to amplifier 6A1, thus causing it to switch to a high state output voltage level. This causes transistors 6Q1 and 6Q2 to turn on. This in turn causes current to flow through rotor coil 44R which raises the current in field windings 703. The increased current in field windings 703 (stator coils 44S) raises the alternator output voltage $V_A$ above 14.0 volts. The output voltage $V_A$ is produced by the phase rectifier bridge comprising diodes 7D4, 7D5, 7D6, 7D7, 7D8, and 7D9 (and the feedback output voltage $V_{A2}$ is provided by an exciter bridge comprising diodes 7D1, 7D2, 7D3) in a conventional manner.

When output voltage $V_A$ rises above 14.0 volts, zener diode 6Z1 conducts current and a voltage appears at the inverting input of amplifier 6A1 that is higher than the voltage on the non-inverting input. This causes amplifier 6A1 to switch from a high voltage state to a low voltage state, thus turning transistors 6Q1 and 6Q2 off. This reduces the output voltage $V_A$ below 14.0 volts.

This on-off switching action maintains the alternator output voltage $V_A$ at 14.0 volts dc, regardless of changes in the alternator shaft rotational speed.

The forward voltage drop of diodes 6D1 and 6D2 decreases at high temperature which increases the voltage level at the top of zener diode 6Z1. This causes zener diode 6Z1 to turn off the voltage regulator 42 earlier in the switching cycle. This causes the nominal alternator output charging voltage to drop to a selected level below 14.0 volts.

The forward voltage drop of diodes 6D1 and 6D2 increases in a low ambient temperature which decreases the voltage level at the top of zener diode 6Z1. This causes zener diode 6Z1 to conduct later in each switching cycle. This causes the nominal alternator output charging voltage to increase above the 14.0 level.

Diode 6D1 could be placed near start battery 10 to obtain a better measure of battery temperature. Alternately, a more suitable temperature sensitive circuit could be used in its place.

The voltage regulator circuit 42 described above is disabled by reducing the base voltage of transistor Q606 to zero. This occurs when all the inputs to NAND gate G1 are in a high state and the input on line L46 is a low state. This set of conditions causes the output of NAND gate G1 to switch to the low state and turn transistor Q606 on. When transistor Q606 switches on it reduces the voltage level on line L606 to the non-inverting input of amplifier 6A1 to zero. This prevents amplifier 6A1 from turning voltage regulator 42 on.

When the overriding deceleration input from circuit 90 on line L46 goes to the high state during vehicle deceleration, the base of transistor Q606 is raised, regardless of the input signal levels to NAND gate G1. This causes transistor Q606 to turn off, thus allowing amplifier 6A1 to operate voltage regulator 42 as required. When any of the lines L6, L7 and L306 are in the low state, the output of NAND gate G1 switches to the high state, thus raising the base of transistor Q606, and enabling voltage regulator 42. When all three lines L6, L7 and L306 are in the high state, regulator 42 is disabled (unless overridden by a high state input on line L46 from the deceleration circuit 90).

Logic NAND gate G1 can be replaced, if desired, by a manual switch operated by the driver. A manual switch can be used to turn voltage regulator circuit 42 on and off in order to switch alternator 40 in and out of the system. A second manual switch could be used to turn solid state switch 32SB on and off to switch start battery 10 in and out of the system.

A meter indicating the state of charge of each battery could be located along with manual solid state switch controls on the instrument panel of the vehicle or in another suitable location. It is to be understood that all of the functions described above and illustrated in FIGS. 1-6 could be performed by manually operated switches if desired.

MICROPROCESSOR SYSTEM CONTROLLED EMBODIMENT OF THE INVENTION

Vehicle Run and Battery Charge Control With a Microprocessor

The non-microprocessor embodiment of the invention described above does not require the sophistication of a microprocessor to control the level of alternator current required to provide rectified output current to the batteries and vehicle loads or alternately to allow the run battery to provide all the vehicle load current.

Nevertheless, there are advantages afforded by using a microprocessor controlled voltage regulator including the ability to operate a complex voltage regulator, to operate a complex display, complex decision making capability, reprogramming flexibility, and a less complex vehicle installation (both as original vehicle equipment and as an aftermarket retrofit apparatus) than the non-microprocessor version.

Most four to sixteen bit microprocessors having suitable memory capacity can be used to replace the discrete circuit non-microprocessor based voltage regulator described in the non-miroprocessor system version of the invention, as will be clear from the following.

Figure 7:
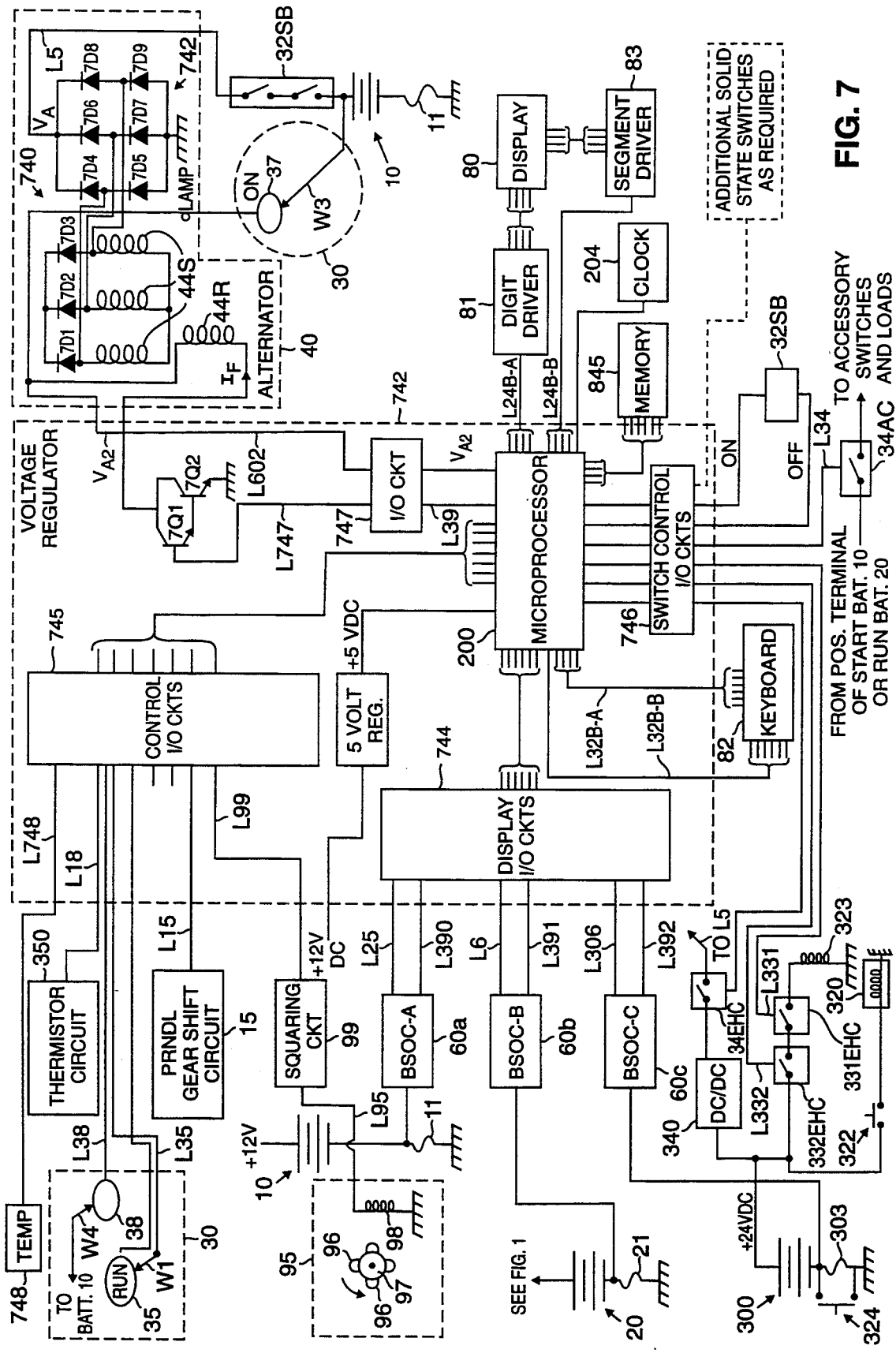
FIG. 7 is a block diagram of a microprocessor controlled three battery fuel saving and reduced emission operating and battery charging system in accordance with a second embodiment of the invention.

Referring to FIG. 7, one suitable microprocessor 200 is a 16-bit microprocessor, Model No. 8397-90, which is available from Intel. This model microprocessor includes a 10-bit analog-to-digital converter, interrupt source inputs, a pulse width modulated output port, a 232 byte register, memory to memory architecture, a 16×16 bit multiplier, a 32 by 16 bit divider, a full duplex serial port, five 8 bit input/output ports, watchdog timers, four 16 bit timers, two external 64K (8K by 8 bits) memory devices, a one milliamp standby current drain, and a display driver interface including an eight segment liquid crystal display 80 and a 6×6 button keyboard 82.

One suitable memory device 845 for use with microprocessor 200 is EPROM Model P27C64/87C64, which is available from Intel. This device includes two 64K (8K×8 bit) memory units which are conventionally connected to the Intel model 8397-90 microprocessor. The pin designations are those provided by the manufacturer. Instructions for programming the Intel Model 8397-90 microprocessor can be found on pages 19-10 through 19-27 of the Intel Automotive Handbook, part order number 231792-002, available from Intel.

In the preferred embodiment, microprocessor 200 is provided with suitable software program instructions in memory so that the vehicle operator can obtain and display information regarding time, date, an alarm function, estimated time of arrival, time on remaining fuel to recharge station, time on remaining fuel to an empty fuel tank, the remaining distance to go on a trip, the distance to travel since the fuel tank was last filled, and the distance to travel on the remaining fuel. Many of these functions may be programmed in a conventional manner by a person of ordinary skill in the art. Devices commonly referred to as trip computers, which incorporate many of these functions, have been commercially available in automotive vehicles at least since 1986.

In accordance with the present invention, microprocessor 200 also may be programmed to provide information regarding fuel efficiency and fuel being consumed in the fuel tank (based on the octane reading of the fuel). This would include average fuel efficiency and miles per gallon, the instantaneous fuel efficiency, the total fuel used on the trip since the trip began, the fuel used since the tank was last refilled, and the fuel left in the tank. Also, the microprocessor 200 may provide information regarding how long the vehicle may continue operating until an external battery recharge is required, the time required to recharge run battery 20 after alternator 40 is switched back in to recharge run battery 20, and how long the vehicle may safely operate in the run state before requiring a recharge. It is noted that in the run state refers to alternator 40 being either switched out or operating at a reduced voltage output that merely maintains a trickle charge on run battery 20 without attempting to fully recharge battery 20.

Also, microprocessor 200 may provide information regarding average vehicle speed and may include an anti-theft capability, based on requiring the driver to enter a code on the keyboard 82 prior to starting the vehicle. Microprocessor 200 also may be utilized to monitor vehicle inputs not indicated above for vehicle diagnostic purposes. By sampling the alternator output load conditions, battery current levels, battery state of charge levels (in amp-hours), and alternator voltage levels, in addition to other vehicle sensory inputs, microprocessor 200 can perform many useful diagnostic functions. For example, a gradual inability to recharge properly any of the batteries, or for any battery to provide appropriate load currents upon demand in certain situations, can result in a diagnostic message indicating a problem with either the given battery, alternator 40, the wiring harness of the vehicle, vehicle loads ($R_L$ and $R_A$), or even battery terminal connections. Microprocessor 200 also can be programmed to identify the following diagnostic conditions: a bad battery, a malfunctioning alternator, a short in a vehicle accessory or wiring harness causing excessive current drain, a bad diode bridge, the onset of a load dump condition, and other related diagnostic matters based on sensed states-of-charge, voltages and currents over time. The bases for these determinations are more fully described in the copending and commonly assigned application Ser. No. 07/919,011.

The input/output circuits 744, 745, 746, and 747 which interface microprocessor 200 and the vehicle sensor signals, are standard scaling, gain, and reset circuits. The design and construction of these circuits as well as the programming of microprocessor 200 are within the abilities of the person of ordinary skill in the art, are well known, and do not require elaboration.

In this embodiment, a pulse width modulated signal is output on line L39 at pin 39 of microprocessor 200, when it passes through input output interface circuit 747. The corresponding pulse width modulated output from circuit 747 on line L747, which is input to the darlington drive transistors 7Q1 and 7Q2, is a pulse train having a fixed period of 256 state times and a programmable width of from 0 to 255 state times. Pulse width is programmed by loading the desired value for optimum fuel economy, as determined by microprocessor 200, into a microprocessor pulse width modulation (PWM) control register (not shown). The varied number of state pulses over the 256 pulse period determines the average current provided by drive transistors 7Q1 and 7Q2 in FIG. 7 to the coil of rotor 44R of alternator 40. Rotor 44R generates a conventional three phase electromagnetic field voltage in the stator coils 44S (see also coils 703 in FIG. 6) having a magnitude proportional to the level of the dc input field current $I_F$. The alternating field current of the stator coils 44S is then rectified by diode bridges 740 (diodes 7D1, 7D2, 7D3) and 742 (diodes 7D4, 7D5, 7D6, 7D7, 7D8, 7D9) to provide the dc output voltage $V_A$ on line L5.

Preferably, microprocessor 200 is programmed for receiving and processing the various sensor input parameters and controlling the alternator 40 output voltage $V_A$ on line L5 between alternator 40 and run battery 20 over the range of 0 to 17 volts, according to a set of defined operating conditions stored in a look-up table or an algorithm. Preferably, look-up tables are used which comprise data curves of, for example, alternator output voltages (start and run conditions, including EHC preheat operations) versus various vehicle load and ambient temperature conditions, states of charge, and other data useful for the aforementioned diagnostic purposes. The data curves preferably correlate the range of sensor parameters and predetermined operating conditions and, in response to the determined inputs, provide a suitable output voltage to maximize fuel economy. The look-up tables utilized by the microprocessor may be empirically derived according to the specific vehicle operating conditions, operating mode, and battery characteristics.

In this embodiment, microprocessor 200 may monitor ambient temperature conditions and engine speed and regulate the bias of the alternator output voltage in a conventional manner. In accordance with the present invention, microprocessor 200 also may monitor the charging current $I_{CH}$ by sensing the voltage signal representing the deceleration of the vehicle, and the state of charge and current signals charge/discharge from BSOC channels 60a, 60b and 60c.

These sensed parameters are then compared to data in the look-up tables and an appropriate output voltage is selected. The look-up table and data stored in memory device 845 provide fuel economy calculation information. Software for microprocessor 200 and the look up tables and algorithms may be created in a conventional manner using an emulator board and stored in memory 845.

A watchdog circuit (not shown in FIG. 7), is located between pins 55 and 45 of Intel model 8377-90 microprocessor 200 and provides a graceful recovery from software errors. In this regard, a 16 bit counter in microprocessor 200 will count state times until it overflows. If an overflow occurs prior to correction of an error, microprocessor 200 is reset. A clock 204 is used for state timing and other signal processing functions. Preferably a 12 MHz clock 204 is employed.

Referring to FIG. 7, the interconnection between microprocessor 200, keyboard 82 and display 80 is shown. In this embodiment, keyboard 82 is a conventional 6×6 keyboard having vertical and horizontal contact lines laid out in a 6×6 grid, and an associated eight character LCD display 80. Such keyboard devices can be readily implemented using the Intel 8397-90 microprocessor. Six of the keyboard lines are connected along line L32B-A, which is a parallel data bus, to pins P2.6, P2.7, P4.7, P4.0, P0.1, and P0.0 on microprocessor 200. The pin numbers are not shown in FIG. 7 for clarity of illustration. The other six keyboard lines are connected by line L32B-B, also a parallel data bus, to pins P4.1–P4.6 on microprocessor 200. The key designation of keyboard 82 is selected by appropriate programming of intersecting contact lines.

Outputs P1.0–P1.4 of microprocessor 200 are connected by line L24B-A, a parallel data bus, to a binary coded decimal digit driver circuit 81, which in turn is connected to display 80. Also, microprocessor 200 outputs P3.0–P3.7 are connected along line L24B-B, a parallel data bus, to segment driver 83, which, in turn, provides information to display 80.

In this driver interactive system, the driver may select which condition of the vehicle or which diagnostic parameter or trip computer function to display at any given time. Accordingly, specific keys in keyboard 82 may be dedicated for displaying state of charge of run battery 20, start battery 10 or EHC battery 300 upon actuation. Alternatively, the key functions may be selected according to a displayed menu of selections, such that different keys have different functions depending on the menu selected.

In addition, microprocessor 200 may be programmed to display the state of charge measures automatically when the state of charge of the respective battery falls below a preselected level or to display an appropriate message when a diagnostic routine indicates that a problem has been detected. Such an automatic display may be accompanied by a warning indication, e.g., a indicator light on the instrument panel or an audible tone. A distinctive warning could be used to indicate to the driver that the vehicle has switched from run battery operation only to running on the alternator, e.g., during a recharge of run battery 20. A suitable message also may be displayed to indicate how long it will take to recharge the battery with the alternator before automatically switching back to run battery operation. Other variations may be selected as a matter of design choice, provided that the selected microprocessor 200 and memory 845 have sufficient processing capability.

The previously discussed microprocessor pulse width modulation (PWM) circuit output on pin 39 and line L39 of microprocessor 200 smoothly varies the current to driver transistors 7Q1 and 7Q2, which in turn smoothly varies the current into rotor 44R in response to system sensor inputs and the dc output level ($V_{A2}$) of alternator 40 on line L602.

Microprocessor 200 compares the level of alternator voltage $V_{A2}$ on line L602 (through interface circuit 747) with a reference voltage level stored in memory. When $V_{A2}$ is higher than the reference voltage, e.g., a nominal 14.6 volts dc, the duty cycle of the PWM output is lowered until $V_{A2}$ returns to 14.6 volts dc. When $V_{A2}$ is below 14.6 volts dc, microprocessor 200 increases the duty cycle until $V_{A2}$ is at 14.6 volts dc. The nominal 14.6 volt level may be altered if required with a software change.

Microprocessor 200 also senses a signal on line L748 from ambient temperature sensor circuit 748, which is passed through input output interface circuit 745 for scaling and shaping, and accordingly adjusts the duty cycle of its PWM output on line L39 to vary the alternator charging voltage ($V_{A2}$) between 16.4 and 13.6 volts in accordance with conventional battery charging current versus temperature requirements.

When wiper W1 of ignition switch 30 is turned to the start position, as shown in FIG. 1, ignition switch contact 32 provides current to actuate start solenoid 31 which pulls in contact 52 thus allowing start battery 10 to provide the current required to operate start motor 50. Microprocessor 200 also actuates EHC solenoid coil 323 during vehicle start by turning on solid state switches 331EHC and 332EHC for a selected timing period of twenty seconds. When switches 331EHC and 332EHC are turned on, as noted, solenoid 323 pulls in ganged power contacts 322 and 324. Power contact 322 routes heater current from EHC battery 300 to the EHC heater coil 320 and contact 324 shorts out shunt 303. At the end of the selected timing period, microprocessor 200 opens solid state switches 331EHC and 332EHC. In the event that microprocessor 200 detects a signal from engine thermistor circuit 350 that corresponds to the engine temperature being above a preselected "hot" temperature, microprocessor 200 opens solid state switch 331EHC, which prevents current from reaching the EHC solenoid coil 323, thus preventing heater current from flowing into the EHC heater coil 320. Separate control lines L331 and L332 respectively connect microprocessor 200 to switches 331EHC and 332EHC. It should be understood that, rather than a timing period, a first signal could be used to close switches 331EHC and the thermistor circuit 350 could be used to open circuit the switch once the engine has reached the desired temperature.

When wiper W1 is returned to the run position, as indicated in FIG. 7, a high input signal is applied on line L35 through I/O circuit 745. This high signal is sensed by microprocessor 200 which, in response, monitors the outputs of BSOC channels 60a, 60b and 60c on lines L25, L6 and L306 respectively, and maintains the output voltage of alternator 40 at a level required to recharge the start, run and EHC batteries 10, 20 and 300 in accordance with ambient temperature requirements. This charging continues until their respective charge levels are above a predetermined point. Again, as in the non-microprocessor version, contact 324 may be omitted where the shunt 303 is a length of battery cable, and BSOC channel 60c may be omitted.

When microprocessor 200 receives signals on lines L25, L6 and L306 from BSOC channels 60a, 60b and 60c respectively indicating that all three batteries are recharged, it reduces the PWM duty cycle on line L39 to cause the alternator output voltage $V_A$ to drop to a level low enough to allow the terminal voltage of run battery 20 to back bias the rectifier diodes 742 on line L5. This removes the engine torque from the shaft of alternator 40 and allows the run battery 20 to provide all the vehicle load current. This is the preferred mode of operation for maximum fuel savings.

Thereafter, when microprocessor 200 receives a signal on line L7 from BSOC channel 60b that indicates run battery 20 state of charge is below a predetermined charge level, microprocessor 200 increases the alternator output voltage to a point where it can operate the vehicle in such a manner that it provides the required load current and a recharge current to run battery 20. (Alternately, the alternator output voltage is raised to a point where run battery 20 does not discharge further, but is not necessarily recharged.) The driver is also warned by display 80 that a source of charge external to the vehicle should be located as soon as possible to recharge run battery 20. An on board battery charger is preferably provided (not shown in FIG. 7, see FIG. 1).

Microprocessor 200 also monitors battery recharge current on lines L390, L391 and L392 which are respectively passed through input output circuit 744, to determine when recharge occurs. (See the output of amplifier A2 on FIG. 2).

In this embodiment, a wheel speed indicator circuit 95 is provided. Circuit 95 includes a permanent magnet 96 on a wheel speed or transmission shaft 97. It produces pulses proportional to wheel speed which are sensed each time magnet 96 passes a stationary pickup coil 98. Consequently, a train of pulses having a period inversely proportional to wheel speed is transmitted on line L95 to a pulse squaring circuit 99. The output of pulse squaring circuit 99 is transmitted on line L99, passed through input output interference circuit 745, to microprocessor 200. Microprocessor 200 thus can sense and record vehicle instantaneous speed, average speed, deceleration, and acceleration. It can use this information in the software program for controlling the system in response to these inputs. Vehicle deceleration, for instance, is computed by calculating the reduction in vehicle speed over a given time period. In particular, the use of wheel speed circuit 95 makes the pendulum circuit 70 of the non-microprocessor embodiment (see FIG. 1) unnecessary in the microprocessor controlled embodiment.

When microprocessor 200 senses vehicle deceleration it increases the output voltage $V_{A2}$ of alternator 40. As a result, the vehicle momentum, rather than the engine, is used to apply torque to the alternator shaft and provide a recharge current for charging run battery 20. This procedure applies recharge current without any fuel expenditure, and effectively extends the time the vehicle loads $R_L + R_A$ can be operated off of run battery 20 without requiring an external recharge or recharging battery 20 by burning fuel.

Microprocessor 200 provides the operational advantage of not having to reduce the excitation current completely from rotor 44R of alternator 40 when the system is operating with run battery 20 providing current to the vehicle electrical loads. Microprocessor 200 can, in response to sensor inputs, provide a pulse width modulated current having a duty cycle just sufficient to provide the lowest possible current to alternator rotor 44R required to avoid sharing current with run battery 20 when it is being used. This removes the alternator torque from the engine as effectively as when all the current is turned off to rotor 44R.

The current to rotor 44R can be smoothly varied by microprocessor 200 to vary the output voltage level of alternator 40 to allow it to (a) share any portion of its output current to the vehicle loads along with run battery 20, (b) share none of its output current with the run battery 20, or (c) provide all of its output current to the vehicle loads and charge run battery 20. The desired alternator operating mode, a, b or c, above could be programmed from keyboard 82 by the system operator.

Microprocessor 200 also provides the capability of being reprogrammed to accommodate changing vehicle operating requirements that may occur between vehicles and with the addition of options.

Current outputs from BSOC channels 60a, 60b, and 60c on lines L390, L391, and L392, respectively, also are sensed by microprocessor 200 at the corresponding outputs of I/O circuit 744. The direction and amplitude of the currents into and out of batteries 10, 20 and 300 on the above lines are monitored for control and display purposes.

Microprocessor 200 also monitors the battery current in each of shunts 11, 21, and 303 for diagnostic and reset purposes. Failure of the charge current to drop below a preselected level on lines L390, L391 and L392 when the state of charge voltage of the monitored battery is above a preset level on lines L25, L6 and L306 respectively, is an indication of a bad cell in the associated battery.

Microprocessor 200 may be used to turn off automatically selected vehicle electrical accessories when the vehicle is parked, the ignition key is in the accessory position, and the start battery state of charge is below a preselected level. In this regard, a high voltage state signal from the "PRNDL" gear shift circuit 15 is transmitted on line L15 (through I/O circuit 745) when the shift lever (not shown) is in the park "P" position. A high voltage state signal also is transmitted on line L38 (passed through I/O circuit 745) when ignition switch wiper W4 is in the accessory position (contact 38) and a low voltage level signal is transmitted on line L25 when the state of charge of start battery 10 is below a preselected level. When these three conditions are satisfied, microprocessor 200 transmits a turn off signal on line L34 to solid state switch 34AC which removes battery discharge current from selected vehicle accessories $R_L$ and $R_A$.

EXAMPLES

The advantages of the present invention are illustrated with reference to the fuel consumption test drives made with a 1988 General Motors Oldsmobile Cutlass, shown in FIG. 8, and a 1984 Ford Mercury Lynx, shown in FIG. 9.

All fuel measurements were made based on two-hour runs, under the weather conditions described below and the load currents on the alternator specified. Plot 8A represents highway driving in warm and dry road conditions. Plot 8B represents a combination of city and highway driving in light to heavy traffic and cool and raining road conditions. Plot 8C represents suburban driving in cool and dry road conditions. Plot 8D represents city driving in cool and dry road conditions. Plot 8E represents city driving in heavy traffic in cool and dry road conditions. Plot 9A represents highway driving. Plot 9B represents suburban driving in light traffic. Plot 9C represents suburban driving in heavy traffic. Plot 9D represents city driving in heavy traffic. For highway traffic, each car was driven one hour in one direction and one hour in the opposite direction, to balance out windage and other factors. Similarly, for suburban and city traffic, the path followed during one hour was essentially reversed during the second hour.

The current load on the alternator was varied by turning on various electrical devices in the car (such as the radio, windshield wiper, headlights, etc.), and was measured by one shunt in series with the alternator and one shunt in series with the battery. The fuel measurements were made by connecting a first fuel-flow meter in series with the gasoline tank supply line and a second fuel-flow meter in series with the fuel pump return line and subtracting the difference.

The percentage fuel savings achieved by operating at zero-load conditions, as compared with various current load conditions, can be calculated by the expression:

$$\% \text{ Fuel Savings} = \frac{MPG_0 - MPG_{LOAD}}{MPG_{LOAD}} \times 100$$

wherein $MPG_0$ is miles per gallon at zero current load on the alternator and $MPG_{LOAD}$ is miles per gallon at the selected load conditions and current load in amps.

The percentage fuel savings for the 1988 Oldsmobile Cutlass are shown below under Table I and in FIG. 8, while those for the 1984 Mercury Lynx are shown under Table II and in FIG. 9. The average of both is shown under Table III. The current load at 18 amps is a hypothetical driving condition based on the curves in FIGS. 8 and 9. With respect to Table III, the overall average includes highway, suburban and city driving, assuming that there is an equal amount of driving in each of these categories.

Figure 8:
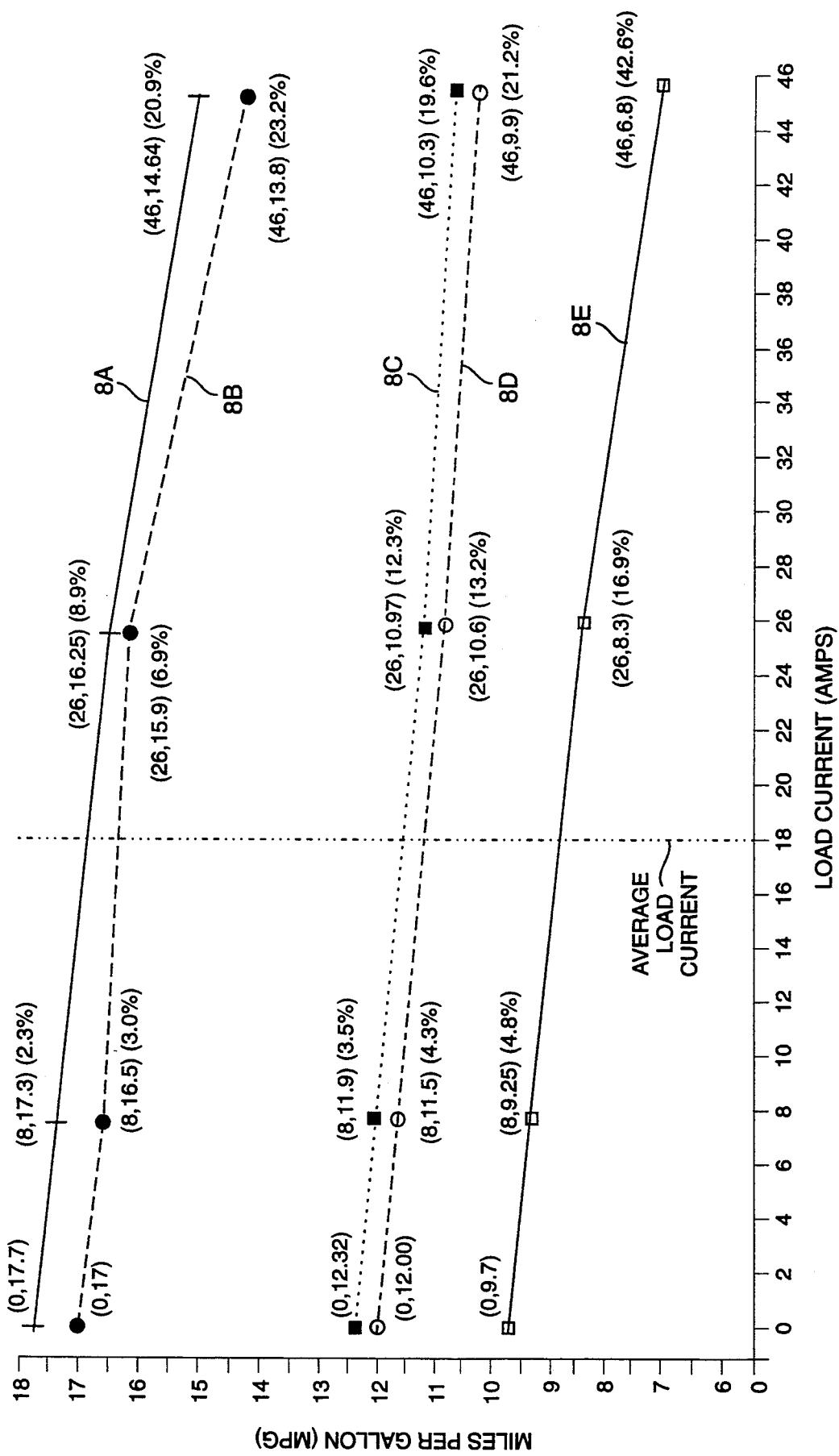
FIGS. 8 and 9 are measured fuel consumption runs for two different vehicles under different operating conditions showing load current in amperes versus miles per gallon and indicating the fuel savings obtained with the non-microprocessor controlled system of FIG. 1.
Figure 9:
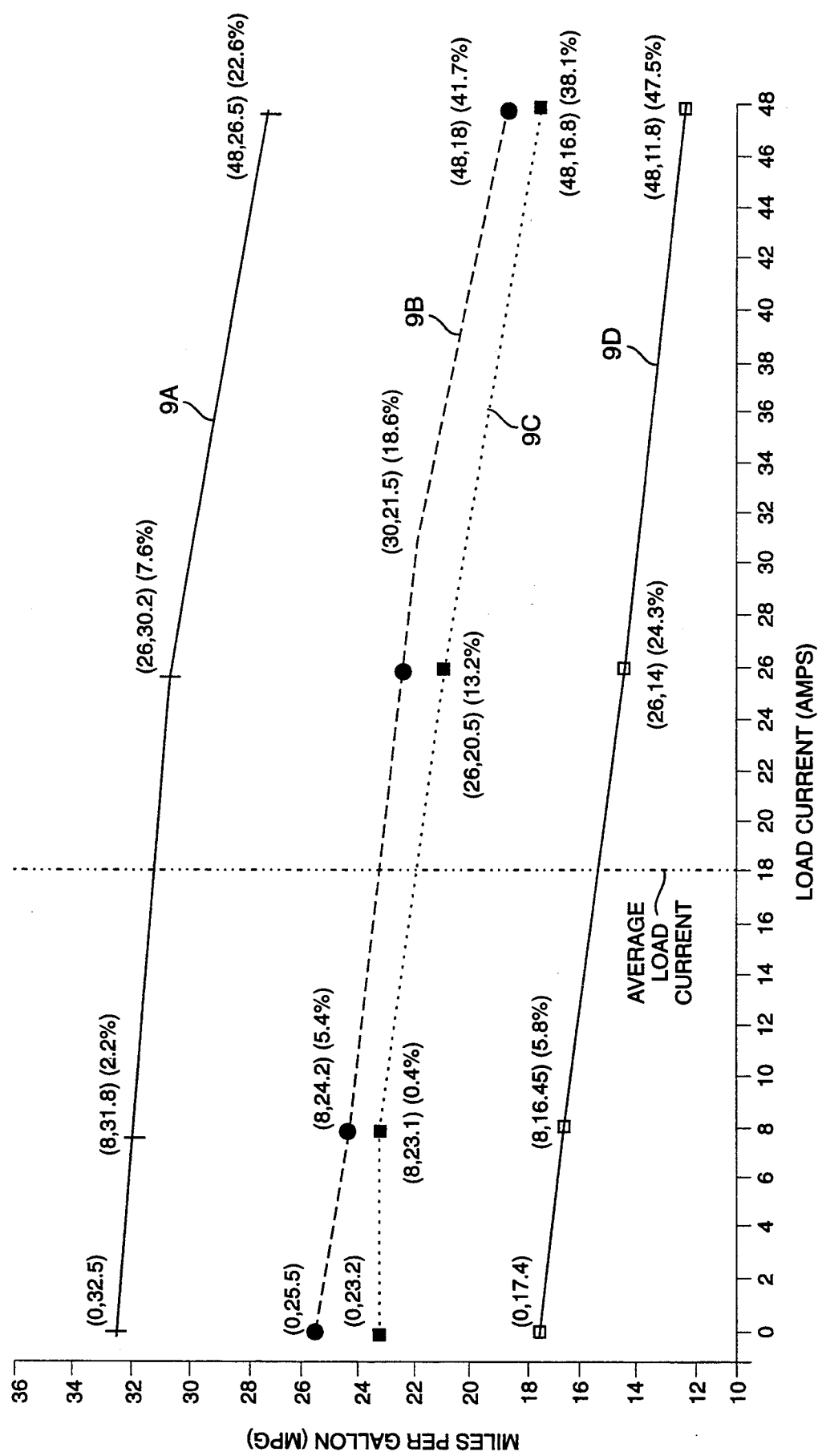

In FIGS. 8 and 9, the parenthetical numbers correspond to (amps, miles per gallon) (% fuel savings).

TABLE I

1988 OLDSMOBILE CUTLASS

| Driving Conditions | $MPG_O$ | $MPG_{LOAD}$ | Current Load (amps) | % Fuel Savings |
|---|---|---|---|---|
| Highway Traffic | 17.7 | 17.3 | 8 | 2.3 |
| | 17.7 | 16.8 | 18 | 5.4 |
| Warm, Dry Conditions | 17.7 | 16.25 | 26 | 8.9 |
| | 17.7 | 14.64 | 46 | 20.9 |
| Highway and City Traffic | 17.0 | 16.5 | 8 | 3.0 |
| | 17.0 | 16.3 | 18 | 4.3 |

TABLE I-continued

1988 OLDSMOBILE CUTLASS

| Driving Conditions | $MPG_O$ | $MPG_{LOAD}$ | Current Load (amps) | % Fuel Savings |
|---|---|---|---|---|
| Rainy, Cool | 17.0 | 15.9 | 26 | 6.9 |
| Conditions | 17.0 | 13.8 | 46 | 23.2 |
| Suburban Traffic | 12.32 | 11.9 | 8 | 3.5 |
| | 12.32 | 11.05 | 18 | 7.6 |
| Cool, Dry Conditions | 12.32 | 10.97 | 26 | 12.3 |
| | 12.32 | 10.3 | 46 | 19.6 |
| City Traffic | 12.0 | 11.5 | 8 | 4.3 |
| | 12.0 | 11.1 | 18 | 8.1 |
| Cool, Dry Conditions | 12.0 | 10.6 | 26 | 13.2 |
| | 12.0 | 9.9 | 46 | 21.2 |
| Heavy City Traffic | 9.7 | 9.25 | 8 | 4.8 |
| | 9.7 | 8.8 | 18 | 10.2 |
| | 9.7 | 8.3 | 26 | 16.9 |
| | 9.7 | 6.8 | 46 | 42.6 |

TABLE II

1984 MERCURY LYNX

| Driving Conditions | $MPG_O$ | $MPG_{LOAD}$ | Current Load (amps) | % Fuel Savings |
|---|---|---|---|---|
| Highway Traffic | 32.5 | 31.8 | 8 | 2.2 |
| | 32.5 | 30.8 | 18 | 5.5 |
| | 32.5 | 30.2 | 26 | 7.6 |
| | 32.5 | 26.5 | 48 | 22.6 |
| Suburban Light Traffic | 25.5 | 24.2 | 8 | 5.4 |
| | 25.5 | 23.0 | 18 | 10.9 |
| | 25.5 | 21.5 | 26 | 18.6 |
| | 25.5 | 18.0 | 48 | 41.7 |
| Suburban Heavy Traffic | 23.2 | 23.1 | 8 | 0.4 |
| | 23.2 | 21.3 | 18 | 8.9 |
| | 23.3 | 20.5 | 26 | 13.2 |
| | 23.22 | 16.8 | 48 | 38.1 |
| City Heavy Traffic | 17.4 | 16.45 | 8 | 5.8 |
| | 17.4 | 15.0 | 18 | 16.0 |
| | 17.4 | 14.0 | 26 | 24.3 |
| | 17.4 | 11.8 | 48 | 47.5 |

TABLE III

Fuel Savings Average for Both Cars

| Current Load | Driving Conditions | Percentage Fuel Savings |
|---|---|---|
| 8 amps | Highway average | 2.5 |
| | Suburban average | 3.1 |
| | City average | 5.0 |
| | Overall average | 3.53 |
| 18 amps | Highway average | 5.1 |
| | Suburban average | 9.1 |
| | City average | 11.4 |
| | Overall average | 8.53 |
| 26 amps | Highway average | 7.8 |
| | Suburban average | 14.6 |
| | City average | 18.1 |
| | Overall average | 13.5 |
| 46 amps | Highway average | 22.2 |
| | Suburban average | 33.1 |
| | City average | 37.1 |
| | Overall average | 30.8 |

The cost savings from recharging run battery 20 from a conventional 115-volt line source is illustrated from the information set forth in Table IV. This information compares the cost of fuel to supply each of a very heavy current load, a moderately heavy current load, and a light current load from the alternator, to the cost of recharging the battery using an external line power charger. All of the examples are based on a 60 amp-hour and 720 volt-amp-hours discharge/charge (a 12-volt battery) while the vehicle was travelling in highway traffic at 60 mph.

The cost of electricity is based on 11.6¢ per Kw-hr, which is a calculated average rate for electricity (summer and winter) for residential use in New York City ca. 1991–92, independent of taxes and other charges. Commercial rates for electricity tend to be higher depending upon volume and time of consumption. If the power source is the battery, corresponding to no load current from the alternator, the cost of electricity to recharge the battery from an external battery charger and restore 720 volt-amp-hours (0.72 Kw-hr), at 11.6¢ per Kw-hr, would be 8.4¢. This amount is the same for all examples.

The cost of fuel is based on $1.30/gallon. If the power source is the alternator, such that no current is provided by the battery, the fuel cost for running the electrical load off the alternator would be:

$$\text{Cost (\$)} = \frac{MPG_0 - MPG_{LOAD}}{MPG_{LOAD}} \times \left[ \frac{\text{time period} \times 60 \text{ MPH}}{MPG_{LOAD}} \right]$$

The time period is selected to obtain the 60 amp-hour discharge for the given current load at 60 MPH. The result of the calculations using the above formula and the data points on Tables I and II are set forth under Table IV below.

TABLE IV

| Current Load (Amps) | Time Period for 60 Amp-Hour Discharge (hours) | Cost of Operating Off The Alternator (¢) | Cost of Recharging From External Charger (¢) | Cost Ratio Fuel/ Electricity |
|---|---|---|---|---|
| 1984 Mercury Lynx - Highway driving at 60 mph | | | | |
| 8 | 7.5 | 39 | 8.4 | 4.6/1 |
| 26 | 2.3 | 42 | 8.4 | 5/1 |
| 48 | 1.25 | 67.6 | 8.4 | 8/1 |
| 1988 Oldsmobile Cutlass - Highway driving at 60 mph | | | | |
| 8 | 7.5 | 76.4 | 8.4 | 9.1/1 |
| 26 | 2.3 | 91 | 8.4 | 10.8/1 |
| 46 | 1.3 | $1.20 | 8.4 | 14.3/1 |

Generally, the greater the current load of the vehicle, the greater the savings when the current load is driven by run battery 20 only, provided that run battery 20 is recharged by an external line power charger.

The improvement in fuel economy realized by the present invention is proportional to the time the alternator is operated at a relatively reduced output voltage, e.g., at 12 or zero volts versus 13.6 to 14.7 volts.

A 10% fuel saving on every gas powered vehicle in the United States would amount to a reduction of 13.5 billion gallons of gasoline per year in the USA. This corresponds to saving approximately 20 billion dollars a year at the retail pump. It also translates into substantial reduction in undesirable gaseous and particulate emissions which result from fuel consumption.

One skilled in the art will appreciate that the present invention can be practiced by other than the described embodiments which are presented for purposes of illustration and not of limitation.

I claim:

1. A battery charging system for an automotive vehicle having electrical accessory circuits and a starter motor for starting a fuel consuming engine comprising:
    a start battery for providing a discharge current for operating the starter motor;
    a run battery for operating the accessory circuits;
    a first device for monitoring the state of charge of the start battery;
    a second device for monitoring the state of charge of the run battery;
    an alternator having a variable output condition including a regulated output voltage at a selectable level and an output current, said alternator being driven by the engine;
    a first circuit for electrically connecting the alternator output to the start battery for charging the start battery;
    a second circuit for electrically connecting the alternator output to the run battery for charging the run battery; and
    a control circuit for selecting and controlling the output condition of the alternator in response to the sensed states of charge of the start battery and the run battery, such that a first alternator output voltage level is normally selected when the sensed state of charge of the start battery is at or above a first preselected charge level and the sensed state of charge of the run battery is at or above a second preselected charge level, and the alternator produces less counter torque on the engine when the first alternator output voltage level is selected relative to the counter torque produced at other times when a second output voltage level, greater than the first output voltage level, is selected.

2. The system of claim 1 wherein the alternator output has
    the second alternator output voltage level and a charging current when the sensed state of charge of the start battery is below the first preselected charge level, and
    a third alternator output voltage level and a charging current when the sensed state of charge of the start battery is at or above the first preselected charge level and the sensed state of charge of the run battery falls below the second preselected charge level.

3. The system of claim 2 wherein the second and third voltage levels are the same.

4. The system of claim 2 wherein the second voltage level corresponds to rapidly recharging the start battery.

5. The system of claim 2 wherein the third voltage level corresponds to rapidly recharging the run battery and the control circuit further comprises means for maintaining the alternator output at the third voltage level after the run battery state of charge falls below the second preselected charge level until the run battery is fully charged.

6. The system of claim 2 wherein the third voltage level corresponds to placing a trickle charging current on the run battery.

7. The system of claim 1 wherein the first preselected charge level corresponds to the start battery having a full state of charge and the second preselected charge level corresponds to the run battery having a state of charge that is selected from between 40% and 100% of a full charge.

8. The system of claim 1 wherein the first voltage level corresponds to no charge current being provided by the alternator to the run battery and the start battery.

9. The system of claim 1 further comprising a display means for indicating the run battery state of charge.

10. The system of claim 1 further comprising a display and means for selecting to display one or more of the start battery state of charge, run battery state of charge, the time required to recharge the run battery, wherein the display is responsive to the selecting means for displaying the selected information.

11. The system of claim 1 wherein the first circuit further comprises a switch for disconnecting the start battery from the alternator output.

12. The system of claim 11 further comprising a circuit for automatically operating the switch for disconnecting the start battery from the alternator output when the start battery state of charge indicates that the start battery is fully charged.

13. The system of claim 1 wherein the second circuit further comprises a switch for disconnecting the run battery from the alternator output.

14. The system of claim 1 further comprising a switch for connecting the run battery and the start battery in parallel.

15. The system of claim 1 wherein the alternator and the control circuit further comprise:
an alternator having a rotor coil and stator coils for providing an alternating current in response to a control current on the rotor coil;
a pulse width modulation circuit for providing a control current with a selected duty cycle to the rotor coil;
a diode bridge having a forward-biased condition for producing the alternator output voltage and current from the alternating circuit and a reversed-biased condition for providing no output current; and
means for selecting the duty cycle of the control current, in response to the sensed states of charge of the run battery and the start battery, from one of a first duty cycle corresponding to the first voltage level, a second duty cycle corresponding to the second voltage level, and a third duty cycle corresponding to the third voltage level.

16. The system of claim 15 wherein the first duty cycle corresponds to no alternator output current.

17. The system of claim 15 further comprising:
a device for monitoring when the vehicle is decelerating; and
a deceleration circuit having a first output in response to the vehicle decelerating at a rate greater than a selected threshold rate;
wherein the means for selecting the duty cycle is responsive to the first output of the deceleration circuit for selecting the duty cycle to be one of the second and third duty cycles.

18. A method for operating a battery charging system for an automotive vehicle having electrical accessory circuits and a starter motor for starting a fuel consuming engine comprising:
providing a start battery having a discharge current for operating the starter motor;
providing a run battery for operating accessory circuits;
monitoring the state of charge of the start battery;
monitoring the state of charge of the run battery;
providing an alternator having a variable output condition including a regulated output voltage at a selectable level and an output current, said alternator being driven by the engine;
controlling the output of the alternator in response to the sensed states of charge of the start battery and the run battery, and normally producing a first alternator output voltage level when the sensed state of charge of the start battery is at or above a first preselected charge level and the sensed state of charge of the run battery is at or above a second preselected charge level, such that the alternator generates less counter torque on the engine when the first alternator output voltage level is produced relative to the counter torque generated at other times when a second output voltage level, greater than the first output voltage level, is produced;
connecting the alternator output to the start battery for charging the start battery; and
connecting the alternator output to the run battery for charging the run battery.

19. The method of claim 18 wherein the alternator output has
the second alternator output voltage level and a charging current when the sensed state of charge of the start battery is below the first preselected charge level, and
a third alternator output voltage level and a charging current when the sensed state of charge of the start battery is at or above the first preselected charge level and the sensed state of charge of the run battery falls below the second preselected charge level.

20. The method of claim 19 wherein the second and third voltage levels are the same.

21. The method of claim 19 wherein the second voltage level corresponds to rapidly recharging the start battery.

22. The method of claim 19 wherein the third voltage level corresponds to rapidly recharging the run battery and the method further comprises, after the run battery state of charge falls below the second charge level, maintaining the alternator output at the third voltage level until the run battery is fully charged.

23. The method of claim 19 wherein the third voltage level corresponds to placing a trickle charging current on the run battery.

24. The method of claim 19 further comprising displaying the run battery state of charge.

25. The method of claim 19 further comprising selectively displaying one or more of the start battery state of charge, run battery state of charge, and the time required to recharge the run battery.

26. The method of claim 18 wherein the first preselected charge level corresponds to the start battery having a full state of charge and the second preselected charge level corresponds the run battery having a state of charge that is selected from between 40% and 100% of a full charge.

27. The method of claim 18 wherein the first voltage level corresponds to no charge current being provided by the alternator to the run battery and the start battery.

28. The method of claim 18 further comprising providing a switch for disconnecting the start battery from the alternator output voltage.

29. The method of claim 28 further comprising automatically disconnecting the start battery from the alternator output voltage when the start battery state of charge indicates that the start battery is fully charged.

30. The method of claim 18 further comprising providing a switch for disconnecting the run battery from the alternator output voltage.

31. The method of claim 18 further comprising providing a switch for connecting the run battery and the start battery in parallel.

32. The method of claim 18 in which the alternator includes an alternator having rotor and stator coils and a diode bridge having a forward-biased condition for providing a dc output voltage and current and a reversed-biased condition for not providing an output current in response to a control current on the rotor coil, further comprising:
   providing the rotor coil with a control current having a selected duty cycle; and
   selecting the duty cycle of the control current, in response to the sensed states of charge of the run battery and the start battery, from one of a first duty cycle corresponding to the first voltage level, a second duty cycle corresponding to the second voltage level, and a third duty cycle corresponding to the third voltage level.

33. The method of claim 32 wherein the first duty cycle corresponds to no alternator output current.

34. The method of claim 32 further comprising:
   monitoring when the vehicle is decelerating; and
   selecting the duty cycle to be one of the second and third duty cycles in response to the vehicle decelerating at a rate greater than a selected threshold rate.

* * * * *